(12) United States Patent
Iisaka et al.

(10) Patent No.: US 6,807,726 B2
(45) Date of Patent: Oct. 26, 2004

(54) ELECTRIC-COMPONENT MOUNTING SYSTEM

(75) Inventors: Jun Iisaka, Nisshin (JP); Koji Shimizu, Koda-cho (JP); Masahiro Tanizaki, Kira-cho (JP); Toshihiro Kondo, Okazaki (JP)

(73) Assignee: Fuji Machine Mfg. Co., Ltd., Chiryu (JP)

(*) Notice: Subject to any disclaimer, the term of this patent is extended or adjusted under 35 U.S.C. 154(b) by 210 days.

(21) Appl. No.: 10/041,638

(22) Filed: Jan. 10, 2002

(65) Prior Publication Data

US 2002/0101214 A1 Aug. 1, 2002

(30) Foreign Application Priority Data

Jan. 16, 2001 (JP) ........................................ 2001-007274

(51) Int. Cl.[7] .................................................. H05K 3/30

(52) U.S. Cl. ............................ 29/740; 29/743; 29/739; 29/721; 29/DIG. 44; 29/833; 414/737; 901/47

(58) Field of Search .......................... 29/740, 739, 743, 29/832, 833, 834, 721; 318/600; 382/151; 198/468.2; 414/416.01, 737; 901/47

(56) References Cited

U.S. PATENT DOCUMENTS

| 5,336,935 | A | * | 8/1994 | Shitanda et al. ............... 29/721 |
| 6,457,232 | B1 | * | 10/2002 | Isogai et al. .................. 29/833 |
| 2001/0042770 | A1 | * | 11/2001 | Hayata et al. ................. 29/740 |
| 2002/0101214 | A1 | * | 8/2002 | Iisaka et al. ................. 318/600 |
| 2002/0108239 | A1 | * | 8/2002 | Isogai et al. .................. 29/834 |

FOREIGN PATENT DOCUMENTS

| JP | A 5-241660 | 9/1993 |
| JP | 2002-217598 | * 8/2002 |

* cited by examiner

Primary Examiner—Minh Trinh
(74) Attorney, Agent, or Firm—Oliff & Berridge, PLC

(57) ABSTRACT

Electric-component mounting system includes a member fixedly disposed on one of a main body and a movable portion, an image-taking device fixedly disposed on the other of the main body and movable portion to take an image of the member. The member and the image-taking device are positioned relative to each other such that an error of relative positioning therebetween detected on the basis of the image of the member substantially represents a positioning error of the member due to thermal expansion of the system. A controller determines a drive signal to operate a drive device, on the basis of the image of the member, so as to reduce an amount of influence of the positioning error of the member on the actual position of the movable portion.

35 Claims, 23 Drawing Sheets

ELECTRIC-COMPONENT MOUNTING SYSTEM

This application is based on Japanese Patent Application No. 2001-007274 filed on Jan. 16, 2001, the contents of which are incorporated hereinto by reference.

BACKGROUND OF THE INVENTION

1. Field of the Invention

The present invention relates in general to an electric-component mounting system, and more particularly to techniques for improving accuracy of mounting of electronic components and other electric components.

2. Discussion of Related Art

An electric-component mounting system is constructed and arranged to mount various kinds of electric components on a board or substrate such as printed-wiring boards. The electric components include resistors, electronic components of chip type such as capacitors, electronic components of flat-package type, and various other types of electronic components with or without leads, such as connectors An electric-component mounting system of such type is generally arranged to hold each electric component by suction, move and position the electric component to and at a predetermined position above a substrate on which the electric components are to be mounted, and mount or place the electric component on the substrate.

Described in detail, the electric-component mounting system of the type described above includes (a) a main body, (b) a movable portion, (c) a drive device, (d) a motion-transmitting member which extends along a straight line and which is operated by the drive device to apply a linear motion along the straight line, to the movable portion, and (e) a controller which is arranged to apply a drive signal to the drive device for controlling the drive device, so as to control the position of the movable portion in the direction of its linear motion. For example, the motion-transmitting member is a ballscrew which is rotated by the drive device such that the ballscrew is not axially movable and such that a rotary motion of the ballscrew is converted into a linear motion of the movable portion. Another example of the motion-transmitting member is a non-rotatable ballscrew which meshes with a ballnut such that a rotary motion of the ballnut is converted into a linear motion of the movable portion. A further example of the motion-transmitting member is a linear stator which slidably engages a slider and whose magnetic force is converted into a linear motion of the slider. The stator and the slider cooperate to constitute a linear motion.

For instance, the electric-component mounting system described above may be arranged such that the movable portion includes a component holder arranged to hold an electric component by suction, and the main body has an image-taking device fixed thereto, to take an image of the electric component as held by the component holder. The controller indicated above is arranged to process the image of the electric component taken by the image-taking device, for detecting an actual hold-position of the electric component as held by the component holder. The controller obtains a positioning error of the electric component, which is an error of the detected actual position of the electric component with respect to a nominal hold-position of the electric component. The controller is further arranged to determine the drive signal to be applied to the drive device, so that the actual mounting position of the electric component is not influenced by the obtained positioning error of the electric component.

The electric-component mounting system described above may be arranged such that the movable portion includes a movable member which is moved relative to the substrate and which carries an another image-taking device fixed thereto, so that this image-taking device is moved with the movable member, to take an image of a fiducial mark provided on the substrate. The controller processes the image of the fiducial mark taken by this image-taking device, to detect an actual position of the substrate, and obtains a positioning error of the substrate, which is an error of the detected actual position with respect to a nominal position of the substrate.

Alternatively, the electric-component mounting system may be arranged to include a plurality of movable portions in the form of a component holder for holding an electric component, and a movable member, and further include a first image-taking device fixed on the main body, and a second image-taking device fixed on the movable member. The first image-taking device is arranged to an image of the electric component as held by the component holder, while the second image-taking device is arranged to taken an image of a fiducial mark provided on the substrate. In this case, the controller indicated above is arranged to process the image of the component taken by the first image-taking device, for detecting the actual hold-position of the electric component as held by the component holder, and obtaining the positioning error of the electric component, which is an error of the detected actual position of the electric component with respect to the nominal hold-position of the electric component. The controller is further arranged to process the image of the fiducial mark taken by the second image-taking device, for detecting the actual position of the substrate, and obtaining the positioning error of the substrate, which is an error of the detected actual position with respect to the nominal position of the substrate. The controller is further arranged to determine the drive signal to be applied to the drive device, so that the actual mounting position of the electric component is not influenced by the obtained two positioning errors, that is, the positioning errors of the electric component and the substrate.

In the electric-component mounting systems which have been described, the drive device usually includes servo-amplifiers, electric motors and other electric devices that generate operating heat, and the movable portion and the motion-transmitting member generate friction heat due to relative movement therebetween. Accordingly, the main body and the motion-transmitting member are inevitably heated and subject to thermal expansion. This thermal expansion causes deterioration of accuracy of mounting of the electric component by the electric-component mounting system.

For reducing the deterioration of the mounting accuracy of the electric component due to the thermal expansion, it has been a conventional practice to perform a warm-up or idling operation of the electric-component mounting system prior to each production run of the system, for positively inducing the thermal expansion of the system. This warm-up operation is desirably continued until the amount of thermal expansion of the system is substantially saturated.

Conventionally, an image of the fiducial mark is taken by the appropriate image-taking device described above, after the warm-up operation, to detect the actual position of the fiducial mark, that is, to obtain the positioning error of the substrate, namely, an error of the actual position of the substrate with respect to the nominal position. In the subsequent production run of the system, the drive signal to be applied to the drive device is compensated for the positioning error obtained on the basis of the image of the fiducial mark immediately after the warm-up operation.

The conventional compensation of the drive signal described above is effective to reduce an influence of the positioning error due to the thermal expansion of the electric-component mounting system, on the actual mounting position of the electric component on the substrate. However, the conventional compensation is not satisfactory to perfectly eliminate the influence of the positioning error due to the thermal expansion. This aspect will be described in detail with respect to the thermal expansion of the ballscrew used as the motion-transmitting member.

Where the positioning error of the fiducial mark is detected on the basis of the image of the mark taken by the image-taking device, as described above, the detected positioning error include an error component due to the thermal expansion of the ballscrew, and the other error component, that is, the positioning error of the substrate per se. These error components cannot be distinguished from each other.

Therefore, the conventional compensation does not a permit accurate positioning of the electric component at the nominal mounting position on the substrate, by correct compensation of the mounting position for the actual mount of the thermal expansion.

It is noted that the positioning error due to the thermal expansion is not constant at different positions along the axis of the ballscrew. Where the ballscrew has a considerably small length, the mounting accuracy of the electric component would not be considerably influenced by a variation of the positioning error, even if the positioning error were assumed to be constant over the entire length of the ballscrew. Where the ballscrew has a relatively large length, however, it is not adequate, for assuring high mounting accuracy of the electric component, to ignore the variation of the positioning error due to the thermal expansion of the ballscrew, which variation takes place in the axial direction of the ballscrew.

The conventional compensation is effected without taking account of the dependency of the thermal expansion amount on the mounting position of the electric component on the substrate, in the axial direction of the ballscrew. Accordingly, the conventional compensation suffers from deterioration of the mounting accuracy of the electric component due to the thermal expansion, particularly where the ballscrew has a relatively large length.

Further, the conventional compensation requires the electric-component mounting system to perform the warm-up or idling operation prior to the production run, undesirably reducing the productive time of the system and lowering the operating efficiency of the system.

SUMMARY OF THE INVENTION

It is therefore an object of the present invention to provide an electric-component mounting system capable of mounting an electric component on the substrate, with a high degree of positioning accuracy of the electric component, irrespective of thermal expansion of the system. This object may be achieved according to any one of the following modes of the present invention, each of which is numbered like the appended claims and depends from the other mode or modes, where appropriate, to indicate and clarify possible combinations of elements or technical features. It is to be understood that the present invention is not limited to the technical features or any combinations thereof which will be described for illustrative purpose only. It is to be further understood that a plurality of elements or features included in any one of the following modes of the invention are not necessarily provided all together, and that the invention may be embodied without some of the elements or features described with respect to the same mode.

(1) An electric-component mounting system wherein an electric component held by a component holder is moved to and positioned at a target mounting position on a substrate, and the positioned electric component is mounted on the substrate, the electric-component mounting system comprising:

a main body structure;

a drive device;

a movable portion movable relative to the main body structure;

a motion-transmitting member disposed on the main body and linearly extending in one direction, the motion-transmitting member being operable to transmit to the movable portion a linear motion in the one direction generated by an operation of the drive device, such that thermal expansion of the motion-transmitting member causes a corresponding positioning error of the movable portion in the direction of the linear motion;

an object fixedly disposed on one of the main body structure and the movable portion;

an image-taking device fixedly disposed on the other of the main body structure and the movable portion and operable to take an image of the object, the object and the image-taking device being positioned relative to each other such that an error of relative positioning of the object and the image-taking device, which is detected on the basis of the image of the object taken by the image-taking device substantially represents a thermal-expansion positioning error which is a positioning error of the object which is derived from thermal expansion of the electric-component mounting system; and a controller operable to apply a drive signal to the drive device, for controlling a position of the movable portion in the direction of the linear motion, the controller determining the drive signal on the basis of the image of the object taken by the image-taking device, so as to reduce an amount of influence of the thermal-expansion positioning error on an actual position of the movable portion in the direction of the linear motion.

In the electric-component mounting system according to the above mode (1) of this invention, the object to be imaged is disposed on one of the main body structure of the system and the movable portion, while the image-taking device to take the image of the object is disposed on the other of the body portion and the movable portion. These object and image-taking device are positioned relative to each other such that the error of positioning of the object relative to the image-taking device, which is detected on the basis of the image of the object taken, substantially represents the thermal-expansion positioning error of the object derived from the thermal expansion of the electric-component mounting system.

Further, the controller determines the drive signal to be applied to the drive device, on the basis of the image of the object taken by the image-taking device, so as to reduce the amount of influence of the thermal-expansion positioning error of the object on the actual position of the movable portion in the direction of its linear motion.

In the electric-component mounting system constructed as described above, the image-taking device alone can detect the thermal-expansion positioning error of the object, so that the electric component can be mounted on the substrate or board with a sufficiently high degree of positioning accuracy, irrespective of the thermal expansion of the electric-component mounting system.

As is apparent from the foregoing explanation, the accuracy of positioning of the electric component as mounted on the substrate is influenced by not only the thermal expansion of the motion-transmitting member but also the thermal expansion of the main body structure of the electric-component mounting system. In the electric-component mounting system according to the above mode (1) of the present invention, the controller is operable to determine the drive signal for the drive device, by taking into account not only a positioning error of the movable portion due to the thermal expansion of the motion-transmitting member, but also a positioning error of the movable portion due to the thermal expansion of the main body structure. The present arrangement permits a sufficiently high degree of positioning accuracy of the electric component as mounted on the substrate, irrespective of the thermal expansion of the motion-transmitting member and main body structure. However, the controller may be arranged to determine the drive signal, by taking account of only one of the two positioning errors of the movable portion which are derived from the thermal expansion of the motion-transmitting member and the thermal expansion of the main body structure, respectively.

For the controller to be able to optimize the drive signal, one of the object and the image-taking device which is fixedly disposed on the main body structure is desirably located at a portion of the main body structure at which the amount of thermal expansion is smaller than at the other portion (e.g., a portion at which the motion-transmitting member is supported), so that the position and attitude of the object or image-taking device disposed on the main body structure is less likely to be influenced by the thermal expansion of the main body structure.

In the present electric-component mounting system, the motion-transmitting member may be arranged to move one movable portion, or a plurality of movable portion.

The term "thermal expansion of the electric-component system" used herein is interpreted to comprehend at least one of the thermal expansion of the main body structure and the thermal expansion of the motion-transmitting member.

(2) An electric-component mounting system according to the above mode (1), wherein the image-taking device is fixedly disposed on the main body structure, at a position at which the image-taking device is not substantially influenced by the thermal expansion of the electric-component mounting system, while the object is fixedly disposed on the movable portion, at a position at which the object is influenced by the thermal expansion of the electric-component mounting system.

In the electric-component mounting system according to the above mode (2), the object and the image-taking device are positioned relative to each other as required according to the above mode (1), that is, such that the error of positioning of the object relative to the image-taking device, which is detected on the basis of the image of the object taken by the image-taking device, substantially represents the thermal-expansion positioning error which is a positioning error of the object which is derived from the thermal expansion of the electric-component mounting system.

The image-taking device may be disposed on the main body structure, at a position at which the image-taking device is not substantially influenced by not only the thermal expansion of the electric-component mounting system but also other factors of the system. In this case, the object is disposed on the movable portion, at a position at which the object is influenced by the thermal expansion of the system but is not substantially influenced by the other factors. For instance, the "other factors of the system" relating to the object include a positioning error of the electric component as held by the component holder which is carried by the movable portion, as described below with respect to the following mode (3).

(3) An electric-component mounting system according to the above mode (1) or (2), wherein the movable portion carries the component holder operable to hold the electric component by suction, and the object is fixedly disposed on the movable portion, while the image-taking device is fixedly disposed on the main body structure, and is operable to take not only the image of the object but also an image of the electric component as held by the component holder.

In the electric-component mounting system according to the above mode (3) wherein the image-taking device is arranged to take not only the image of the object but also the image of the electric component, the required number of image-taking devices can be made smaller than in a system which uses two image-taking devices for taking the images of the object and electric component, respectively.

(4) An electric-component mounting system according to any one of the above modes (1)–(3), wherein the movable portion includes a first movable portion, and a second movable portion which carries the component holder operable to hold the electric component by suction, and the motion-transmitting member includes a first motion-transmitting member and a second motion-transmitting member which are operable to move the first and second movable portions, respectively, and which extend in respective directions intersecting each other, the first motion-transmitting member being directly mounted at one of opposite ends thereof on the main body structure, while the second motion-transmitting member being mounted at one of opposite ends thereon on the first movable portion and indirectly mounted on the main body structure, the object being fixedly disposed on the second movable portion.

In the system according to the above mode (4), the first movable portion is movable in a first direction parallel to the direction of extension of the first motion-transmitting member, while the second movable portion is movable in the first direction and a second direction which is parallel to the direction of extension of the second motion-transmitting member and which intersects the first direction. Further, the component holder and the object to be imaged by the image-taking device are both provided on the second movable portion, so that the component holder and the object are always moved together.

In the system described above, therefore, both of the thermal expansion of the first motion-transmitting member in its direction of extension and the thermal expansion of the second motion-transmitting member in its direction of extension can be detected on the basis of the image of the object taken by the image-taking device, so that the component holder can be moved so as to minimize an influence of those thermal expansions, by determining the drive signal on the basis of the detected thermal expansions.

In one form of the system according to the above mode (4), the main body structure has a portion which extends in a direction (e.g., X-axis direction described below) intersecting the direction of extension (e.g., Y-axis direction) of the first motion-transmitting member, and which portion comparatively easily suffers from thermal expansion in its direction of extension. Further, the first motion-transmitting member is directly mounted at its one end on that portion of the main body structure, and the second motion-transmitting member extends in parallel with the direction of extension of the above-indicated portion of the main body structure and has a smaller length than the first motion-transmitting member so that the second motion-transmitting member is less likely to suffer from the thermal expansion than the first motion-transmitting member. In this form of the system, the mounting accuracy of the electric component is influenced by a positioning error due to its thermal expansion in its direction of extension (Y-axis direction), and a positioning error due to the thermal expansion of the above-indicated portion of the main body structure in its direction of extension (X-axis direction). Accordingly, the controller is arranged to eliminate or reduce the deterioration of the mounting accuracy of the electric component due to one or both of the positioning errors caused by the thermal expansions in the above-indicated two directions (Y-axis and X-axis directions). This form of the system is applicable to the system according to the following mode (5).

(5) An electric-component mounting system according to any one of the above modes (1)–(3), wherein the movable portion includes a first movable portion, and a second movable portion which carries the component holder operable to hold the electric component by suction, and the motion-transmitting member includes a first motion-transmitting member and a second motion-transmitting member which are operable to move the first and second movable portions, respectively, and which extend in respective directions intersecting each other, the first motion-transmitting member being directly mounted at one of opposite ends thereof on the main body structure, while the second motion-transmitting member being mounted at one of opposite ends thereon on the first movable portion and indirectly mounted on the main body structure, the object being fixedly disposed on the second movable portion.

In the system according to the above mode (5), the first movable portion is movable in a first direction parallel to the direction of extension of the first motion-transmitting member, while the second movable portion is movable in the first direction and a second direction which is parallel to the direction of extension of the second motion-transmitting member and which intersects the first direction, as in the system according to the above mode (4). Unlike the system according to the above mode (4), however, the system according to the above mode (5) is arranged such that the object is not provided on the second movable portion which carries the component holder, but is provided on the first movable portion. Accordingly, the object is movable only in the direction of extension of the first motion-transmitting member, in the system according to the above mode (5).

In the system according to the above mode (5), therefore, the thermal expansion of the first motion-transmitting member in the first direction can be detected on the basis of the image of the object provided on the first movable portion, but the thermal expansion of the second motion-transmitting member in the second direction cannot be detected on the basis of the image of the object.

Where the two motion-transmitting members extending in the mutually intersecting directions are used to move the component holder, it is not necessarily equally important to detect the thermal expansions of the two motion-transmitting members. Generally, the first motion-transmitting member directly mounted on the main body structure has a larger length and accordingly suffers from a larger amount of thermal expansion than the second motion-transmitting member. For this reason, in particular, it is more important to detect the thermal expansion of the first motion-transmitting member than to detect the thermal expansion of the second motion-transmitting member. In some cases, the mounting accuracy of the electric component is not significantly deteriorated even if the thermal expansion of the second motion-transmitting member is not taken into account when the drive signal for the drive device is determined.

If the object is provided on the second movable portion where the detection of the thermal expansion of the second motion-transmitting member is not so important, the provision of the object on the second movable member merely results in an increase in the total weight of the second movable portion and members provided to hold the object on the second movable portion, undesirably increasing a tendency of lowering a kinetic response of the component holder to not only the drive signal to move the component holder in the second direction, but also the drive signal to move the component holder in the first direction. In this case, the second movable portion must be always moved together with the object and the members used to hold the object, as well as the component holder.

Where the object is provided on the first movable portion, on the other hand, the total weight of the first movable portion and members used to hold the object on the first movable portion is increased, and this increased total weight tends to deteriorate the kinetic response of the component holder to the drive signal to move the component holder in the first direction, but does not deteriorate the kinetic response to the drive signal to move the component holder in the second direction. Namely, the component holder alone is moved in the second direction.

Therefore, the system according to the above mode (5) wherein the object is provided on the first movable portion is advantageous in that it is possible to reduce the deterioration of the kinetic response of the component holder to the drive signals, where the detection of the thermal expansion of the first motion-transmitting member is more important than the detection of the thermal expansion of the second motion-transmitting member.

(6) An electric-component mounting system according to any one of the above modes (19–(3), wherein the movable portion includes a first movable portion, and a second movable portion which carries the component holder operable to hold the electric component by suction, and the motion-transmitting member includes a first motion-transmitting member and a second motion-transmitting member which are operable to move the first and second movable portions, respectively, and which extend in respective directions intersecting each other, the first motion-transmitting member being directly mounted at one of opposite ends thereof on the main body structure, while the second motion-transmitting member being mounted at one of opposite ends thereon on the first movable portion and indirectly mounted on the main body structure, the object consisting of two objects fixedly disposed on the first and second movable portions, respectively.

In the system according to the above mode (6), the thermal expansion which influences the second motion-transmitting member includes a first component derived from the thermal expansion of the second motion-transmitting member per se (which first component varies depending upon the position along the length of the second motion-transmitting member, for example), and a second component derived from the thermal expansion of a portion of the main body structure at which the first motion-transmitting member is fixedly supported at its proximal end (which second component does not vary depending upon the position along the length of the second motion-transmitting member).

In the system according to the above mode (6), the two objects are provided for the respective two motion-transmitting members, so that the first component of the thermal expansion can be detected on the basis of the image of the object provided for the second motion-transmitting member, while the second component can be detected on the basis of the image of the object provided for the first motion-transmitting member.

As described above, the provision of the two objects for the respective two motion-transmitting members permits detections of the two components of the thermal expansion influencing the second motion-transmitting member, independently of each other. The two components are different from each other in that the first component varies depending upon the position along the length of the second motion-transmitting member, while the second component does not vary depending upon this position. It is important to take account of this difference when the drive signal to move the second movable member is controlled by the controller, so as to prevent or reduce the influence of the thermal expansion on the mounting accuracy of the electric component.

However, the provision of the two objects for the respective two motion-transmitting members is not essential to detect the above-indicated two components of the thermal expansion which influences the second motion-transmitting member. Namely, the two components can be detected by providing only the second movable portion with the object, and providing a first image-taking device arranged to take an image of the object when the second movable portion is located at a position sufficiently near the proximal end of the second motion-transmitting member, that is, at a position at which position of the second movable is considerably influenced by the thermal expansion of the main body structure), and a second image-taking device arranged to take an image of the object when the second movable portion is located at a position which is sufficiently spaced from the proximal end of the second motion-transmitting member, that is, at a position at which the position of the second movable portion is considerably influenced by the thermal expansion of the second motion-transmitting member. In this form of the system, the second component can be detected on the basis of the image of the object taken by the first image-taking device, and the first component can be detected on the basis of the image of the object taken by the second image-taking device.

(7) An electric-component mounting system according to the above mode (1), wherein the object is fixedly disposed on the main body structure, at a position at which the object is not substantially influenced by the thermal expansion of the electric-component mounting system, while the image-taking device is fixedly disposed on the movable portion, at a position at which the image-taking device is influenced by the thermal expansion of the electric-component mounting system.

In the electric-component mounting system according to the above mode (7), too, the object and the image-taking device are positioned relative to each other as described above with respect to the above mode (1). The image-taking device may be disposed on the main body structure, at a position at which the image-taking device is not substantially influenced by not only the thermal expansion of the electric-component mounting system but also other factors of the system. In this case, the object is disposed on the movable portion, at a position at which the object is influenced by the thermal expansion of the system but is not substantially influenced by the other factors. For instance, the "other factors of the system" relating to the object in this mode (7) include a positioning error of the substrate.

(8) An electric-component mounting system according to any one of the above modes (1)–(7), wherein the movable portion includes a movable member which is movable relative to the substrate and which carries the image-taking device, the image-taking device being moved with the movable member to take an image of a fiducial mark provided on the substrate, as well as the image of the object, the object being fixedly disposed on the main body structure.

In the electric-component mounting system according to the above mode (8), the image-taking device is operable to take not only the image of the object but also the image of the fiducial mark provided on the substrate. Accordingly, the required number of image-taking devices can be made smaller than in a system which uses two image-taking devices for taking the images of the object and the fiducial mark, respectively.

(9) An electric-component mounting system according to the above mode (1), wherein the movable portion consists of a plurality of movable portions at least one of which includes the component holder operable to hold the electric component by suction, at least one of the other of the plurality of movable portions including a movable member movable relative to the substrate, for the image-taking device to take an image of a fiducial mark provided on the substrate, the object consisting of a plurality of objects including at least one first object fixedly disposed on the at least one movable portion, and at least one second object which corresponds to the at least one of the other of the plurality movable portions and which is fixedly disposed on the main body structure, the image-taking device consisting a plurality of image-taking devices including at least one first image-taking device which corresponds to the at least one movable portion and each of which is fixedly disposed on the main body portion and operable to take not only an image of the at least one first object but also an image of the electric component held by the component holder, the plurality of image-taking device further including at least one second image-taking device which is fixedly disposed on the at least one of the other of the plurality of movable portions, for taking not only an image of the at least one second object but also the image of the fiducial mark, and wherein the controller determines the drive signal, on the basis of the images of the at least one first object and the electric component taken by the at least one first image-taking device and the images of the at least one second object and the fiducial mark taken by the at least one second image-taking device, so as to reduce the amount of influence of the thermal-expansion positioning error on the actual position of each of the plurality of movable portions in the direction of the linear motion.

(10) An electric-component mounting system according to any one of the above modes (1)–(9), comprising a plurality of positioning devices each of which consists of the movable portion, the drive device and the motion-transmitting member, and wherein a set of the object and the image-taking device is provided for each of the plurality of positioning devices.

In the electric-component mounting system according to the above mode (10), the positioning error of each movable portion due to the thermal expansion can be detected.

Accordingly, it is possible to deal with the thermal expansion at each of the motion-transmitting members and the thermal expansion at each of the portions of the main body structure at which the motion-transmitting members are mounted.

(11) An electric-component mounting system according to any one of the above modes (1)–(10), wherein one of the object and the image-taking device which is fixedly disposed on the main body structure is provided at a plurality of positions which are spaced apart from each other in the direction of extension of the motion-transmitting member.

The electric-component mounting system according to any one of the above-described modes (1)–(10) may be arranged such that only one object or image-taking device is fixedly disposed on the main body structure. In this form of the system, the controller determines the drive signal, on an assumption that the amount of thermal expansion at a reference point established along the length of the motion-transmitting member is zero. For instance, the reference point is located at the proximal end of a ballscrew provided as the motion-transmitting member, at which the ballscrew is fixedly supported. In this case, the controller may be arranged to estimate the amount of thermal expansion at a given axial position of the motion-transmitting member, on the basis of the image of the object taken by the image-taking device at that axial position spaced from the reference point in the axial direction of the motion-transmitting member, on the above-described assumption, and on an assumption that the amount thermal expansion is proportionally increased with a distance of the above-indicated axial position from the reference point.

However, the amount of thermal expansion at the reference point is not actually necessarily zero. Further, the amount of thermal expansion at an axial position of the motion-transmitting member may not be actually proportionally increased with the distance of that axial position from the reference point.

In the electric-component mounting system according to the above mode (11), the two or more objects or image-taking devices are fixedly disposed on the main body structure such that the objects or image-taking devices are arranged in the direction of extension or axial direction of the motion-transmitting member.

In the present system, therefore, the amounts of thermal expansion can be detected at different axial positions of the motion-transmitting member, so that the amount of thermal expansion at a given axial position of the motion-transmitting member can be detected or estimated with a higher degree of accuracy in the present system than in a system in which only one object or only one image-taking device is disposed on the main body structure.

(12) An electric-component mounting system according to any one of the above modes (1)–(11), wherein the object has a central portion and a peripheral portion which are imaged by the image-taking device such that the central portion and the peripheral portion can be distinguished from each other, the central portion and the peripheral portion lie in respective two parallel planes which are spaced from the image-taking device by respective different distances when the image of the object is taken by the image-taking device, the central portion lying on one of the two parallel planes which is nearer to the image-taking device than the other plane.

In the electric-component mounting system according to the above mode (12) wherein the central and peripheral portions of the object lie in respective two parallel planes, the central and peripheral portions can be imaged such that these portions are distinguished from each other with different degrees of contrast, which are established by mechanical means, that is, by relative positioning of the central and peripheral portions with respect to the image-taking device.

Accordingly, the controller can detect the position of the object with a higher degree of accuracy on the basis of the positions of the clearly distinguished central and peripheral portions, making it possible to improve the accuracy of imaging of the object and accordingly improve the accuracy of detection of the positioning error of the movable portion on the basis of the image of the object.

(13) An electric-component mounting system according to the above mode (12), wherein the central portion has a surface having a lower value of brightness than a surface of the peripheral portion.

(14) An electric-component mounting system according to the above mode (13), wherein the surface of the central portion has a lower value of light reflectance than the surface of the peripheral portion.

(15) An electric-component mounting system according to the above mode (13), wherein the surface of the central portion does not emit a light while the surface of the peripheral portion emits a light.

(16) An electric-component mounting system according to any one of the above modes (12)–(15), wherein the object includes a main body, and a projecting portion extending from a surface of the main body, the central portion consisting of a distal end face of the projecting portion, while the peripheral portion consisting of a portion of the surface of the main body which surrounds a proximal end of the projecting portion.

(17) An electric-component mounting system according to the above mode (16), wherein the end face of the projecting portion has a circular shape.

In the electric-component mounting system according to the above mode (17), the projecting portion has a circular end face which functions as the central portion of the object. The circular central portion need not be positioned in its circumferential direction, so as to establish a predetermined angular position. In other words, the angular position of the circular central portion does not have an influence on the image of the central portion taken by the image-taking device, and the controller need not take into account the angular position of the central portion of the object, in determining the drive signal for the drive device so as to assure high positioning accuracy of the electric component as mounted on the substrate.

(18) An electric-component mounting system according to the above mode (16) or (17), wherein the end face of the projecting portion has an outer profile located outwardly of an outer profile of the proximal end, as seen in a direction in which the image of the object is taken by the image-taking device.

In the electric-component mounting systems according to the above modes (16) and (17), the projecting portion may be a cylindrical member having a constant diameter over its entire length. In this case, the outer profile of the distal end face of the projecting portion is aligned with that of the proximal end of the projecting portion, as seen in the direction in which the image of the object is taken by the image-taking device. In this arrangement, however, the boundary between the central and peripheral portions of the object may be obscure, if the outer profile of the distal end face is partly or totally located inwardly of the outer profile of the proximal end of the projecting portion, for some reason or other, for instance, due to a dimensional error of the projecting portion during its manufacture. In this case, the drive signal cannot be suitably determined by the controller, on the basis of the image of the object taken by the image-taking device.

In the electric-component mounting system according to the above mode (18), however, the outer profile of the distal end face of the projecting member is located outwardly of the outer profile of the proximal end.

This arrangement of the projecting portion is effective to prevent deterioration of the clarify of the boundary between the central and peripheral portions of the object due to the dimensional error of the projecting portion, or for any other reasons, in the image of the object taken by the image-taking device.

Where the peripheral portion is provided by a planar element which covers the above-indicated portion of the surface of the main body and the thickness of which is substantially zero, the proximal end of the projecting portion is substantially flush with the surface of the planar element. Where the thickness of the planar element providing the peripheral portion is not substantially zero, the projecting portion may be a projecting part of a projecting member which has a proximal end portion located within the thickness of the planar element. In this case, the proximal end of the projecting portion is the proximal end of the above-indicated projecting part of the projecting member.

(19) An electric-component mounting system according to the above mode (18), wherein the peripheral portion is provided by an adhesive-backed layer attached to the above-indicated portion of the surface of the main body, and the projecting portion is a projecting part of a projecting member, the projecting part having the distal end face of the projecting portion, and a proximal end face opposite to the distal end face, the projecting member including a proximal end part having a smaller size in transverse cross section than the projecting part, the projecting member having a shoulder surface formed between the proximal end part and the proximal end face of the projecting part, the adhesive-backed layer having a through-hole in which the proximal end part is fitted such that the shoulder surface is held in contact with a portion of the adhesive-backed layer in which the through-hole is formed.

In the electric-component mounting system according to the above mode (19), the peripheral portion of the object is provided by an adhesive-backed layer, and the projecting portion is a projecting part of a projecting member, which projecting part has the distal end face of the projecting portion and a proximal end face opposite to the distal end face. The adhesive-backed layer has a through-hole through which the proximal end part of the projecting member extends for attachment to the main body. Since the size of the proximal end part fitted in the through-hole is smaller than that of the projecting part having the distal end face providing the central portion, a dimensional error of the through-hole during its manufacture does not obscure the boundary between the central and peripheral portions of the object. In other words, the periphery of the distal end face of the projecting part in the image of the object taken by the image-taking device is not obscured by the periphery of the through-hole even if the actual size of the through-hole is larger than the nominal size due to a dimensional error of the through-hole.

(20) An electric-component mounting system according to any one of the above modes (1)–(19), wherein the controller includes imaging-frequency control means for operating the image-taking device to take the image of the object more frequently when a rate of change of the thermal-expansion positioning error is relatively high than when the rate of change is relatively low.

In the electric-component mounting system according to the above mode (20), the imaging-frequency control means prevents unnecessarily frequent operation of the image-taking device to take the image of the object for detecting the thermal expansion, making it possible to reduce the deterioration of the mounting accuracy of the electric component due to the thermal expansion, without sacrificing the operating efficiency of the electric-component mounting system.

(21) An electric-component mounting system according to any one of the above modes (1)–(20), wherein the controller includes proportional-type drive-signal determining means for determining the drive signal, so as to reduce the amount of influence of the thermal-expansion positioning error on the actual position of the movable portion in the direction of the linear motion, on an assumption that an amount of thermal expansion of the motion-transmitting member at a given position in the direction of the linear motion is proportionally increased with a distance of the given position from a predetermined reference point established on the motion-transmitting member in the direction of the linear motion.

In the electric-component mounting system according to the above mode (21), the drive signal to be applied to the drive device can be suitably determined by the controller, where the motion-transmitting member is fixedly supported at one of its opposite ends, since the controller determines the drive signal, in view of a tendency that the amount of thermal expansion of the motion-transmitting member at a given axial position thereof is proportionally increased as the distance of the axial position from the predetermined reference point is increased.

BRIEF DESCRIPTION OF THE DRAWINGS

The above and other objects, features, advantages and technical and industrial significance of the present invention will be better understood by reading the following detailed description of presently preferred embodiments of the invention, when considered in connection with the accompanying drawings, in which.

DETAILED DESCRIPTION OF THE PREFERRED EMBODIMENTS

Figure 1:
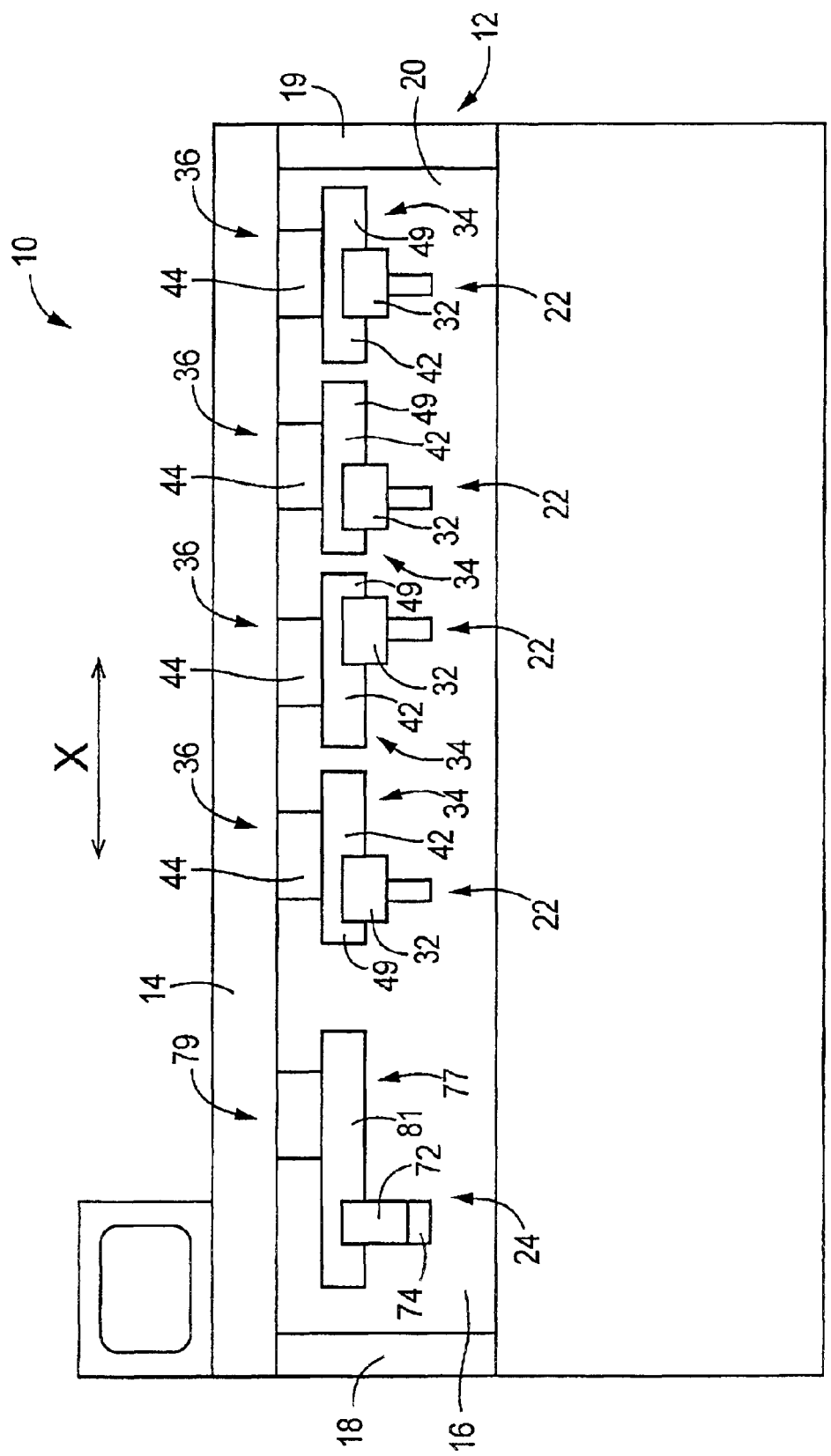
FIG. 1 is a front elevational view of an electric-component mounting system 10 constructed according to one embodiment of this invention.

Some presently preferred embodiments of this invention will be described in detail by reference to the drawings. Referring first to the front elevational view of FIG. 1, there is shown an electric-component mounting system in the form of an electronic-component mounting system 10 according to the first embodiment of the invention. This electronic-component mounting system 10 (hereinafter referred to simply as "mounting system 10") has a frame 12, which includes a top wall 14, a back wall 16, a left wall 18 and a right wall 19. These walls 14, 16, 18, 19 cooperate to form an internal space 20.

On the frame 12, there are mounted a plurality of component-mounting robots 22 and an image-taking robot 24 such that these robots 22, 24 are located within the internal space 20 of the frame 12. The component-mounting robots 22 are arranged to mount electric components in the form of electronic components on a substrate 26. The present electronic-component mounting system 10 has an X-axis direction which lies in a horizontal plane and which is parallel to the right and left direction as seen in FIG. 1. The plurality of component-mounting robots 22 and the image-taking robot 24 are disposed on the frame 12 such that the robots 22, 24 are spaced apart from each other in the X-axis direction.

Figure 2:
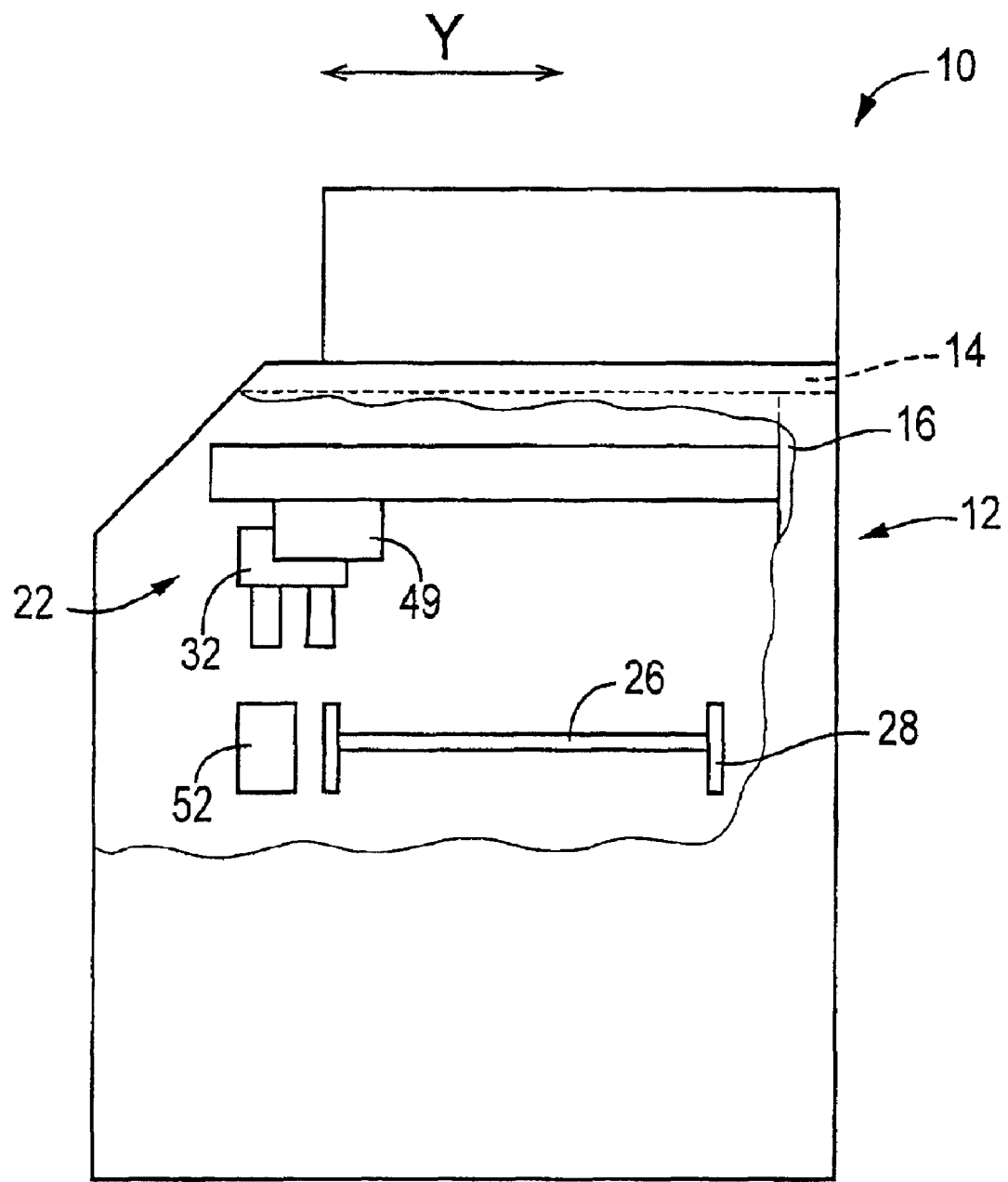
FIG. 2 is a side elevational cutaway view of the electric-component system of FIG. 1.
Figure 3:
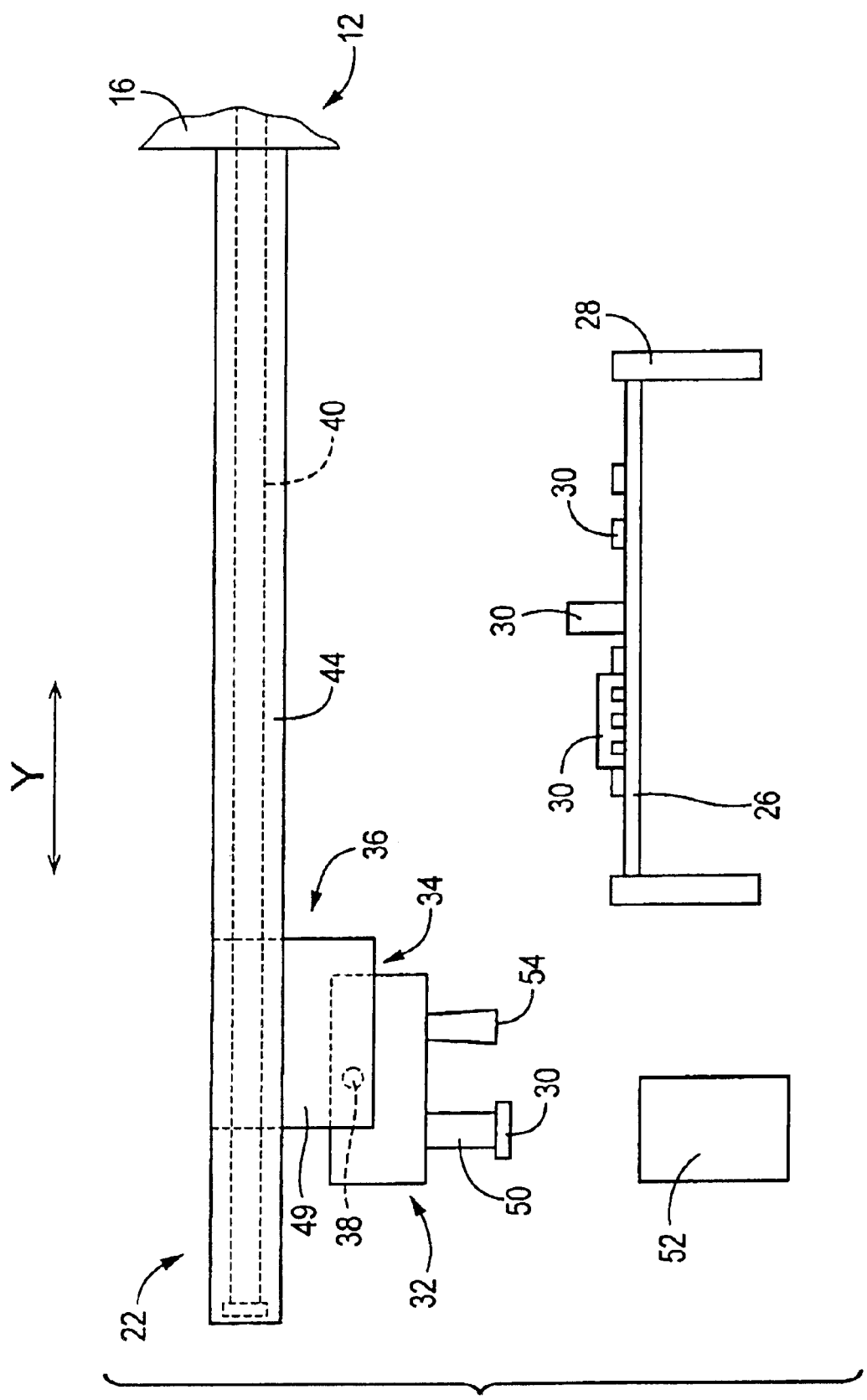
FIG. 3 is a side elevational view showing Y-axis positioning device 36 located at a component-imaging position in a component-mounting robot 22 of FIG. 1, together with a first image-taking device 52.

As shown in the side elevational cutaway view of FIG. 2, a conveyor 28 is disposed on the frame 12, for transferring the substrate 26 on which the electronic components are to be mounted. This conveyor 28 is arranged to feed and position the substrate 26 along a predetermined path which extends below the component-mounting robots 22 and the image-taking robot 24 and in the X-axis direction. The substrate 26 is positioned by the conveyor 28, at a predetermined image-taking position right below the image-taking robot 24, and at predetermined component-mounting positions right below the respective component-mounting robots 22. FIG. 3 shows the substrate 26 which is supported by the conveyor 28 and on which are mounted a plurality of electronic components 30.

The present electronic-component mounting system 10 has a Y-axis direction which also lies in the horizontal plane and which is parallel to the right and left direction as seen in FIG. 2 and is perpendicular to the X-axis direction.

As shown in FIG. 1, each of the component-mounting robots 22 has a component-mounting head 32 arranged to hold each electric component in the form of an electronic component 30 to be mounted on the substrate 26. The component-mounting robot 22 is arranged to move the component-mounting head 32 to a desired position in a horizontal XY plane defined by the X-axis Y-axis direction. To this end, each component-mounting robot 22 includes an X-axis positioning device 34 operable to move the component-mounting head 32 in the X-axis direction, and a Y-axis positioning device 36 operable to move the component-mounting head 32 in the Y-axis direction.

Each of the X-axis and Y-axis positioning devices 34, 36 includes a movable portion, and a ballscrew mechanism for moving the movable portion in the X-axis or Y-axis direction. Described in detail, the two positioning devices 34, 36 include respective ballscrews 38, 40, as shown in FIG. 3, respective ballnuts (not shown) engaging the respective ballscrews 38, 40, respective support structures 42, 44 (shown in FIGS. 1 and 3) for supporting the ballscrews 38, 40 and nuts, and respective rotary drive devices in the form of servomotors 46, 48 (shown in FIG. 11) operable to rotate the ballscrews 38, 40 or the ballnuts. The support structures 42, 44 support the ballscrews 38, 40 and the ballnuts such that the ballscrews 38, 40 are neither rotatable nor axially movable relative to the frame 12 (support portion or guide rail) while the ballnuts are rotatable relative to the movable portion and not axially movable relative to the movable portion. In this case, the ballnuts are rotated by the servomotors 46, 48. Alternatively, the support structures 42, 44 support the ballscrews 38, 40 and the ballnuts such that the ballscrews 38, 40 are rotatable and not axially movable relative to the frame 12 (support portion or guide rail) while the ballnuts are neither rotatable nor axially movable relative to the movable portion. In this case, the ballscrews 38, 40 are rotated by the servomotors 46, 48.

The support structure 42 of the X-axis positioning device 34 includes an X-axis guide rail 49 for guiding the X-axis movable portion (in the form of the component-mounting head 32) in the X-axis direction, as shown in FIG. 1, while the support structure 44 of the Y-axis positioning device 36 includes a Y-axis guide rail for guiding the Y-axis movable portion (in the form of the X-axis guide rail 49) in the Y-axis direction, as shown in FIG. 2.

In an ordinary ballscrew mechanism, the ballscrew is fixedly supported at one or both of its opposite ends. In the present embodiment, each of the ballscrews 38, 40 is fixedly supported at its one end, as indicated in FIG. 3 which shows the Y-axis ballscrew 40 by way of example. Namely, the ballscrew 40 extending in the Y-axis direction is fixedly supported at its one end by the back wall 16 of the frame 12, at a vertical position relatively close to the top wall 14, as indicated in FIG. 2. The ballscrew 38 extending in the X-axis direction is fixedly supported at its one end by corresponding end portion of the X-axis guide rail 49.

As described above, each component-mounting robot 22 is provided with the component-mounting head 32. This component-mounting head 32 includes a component holder 50 adapted to hold, by suction, one of the electronic components 30 which are supplied from a component-supply device (not shown) and which are to be mounted on the substrate 26. The component holder 50 extends vertically downwards from the component-mounting head 32.

The electronic component 30 as held by the component holder 50 is not necessarily located at the nominal position with respect to the component holder 50 in the X-axis and Y-axis directions. Accordingly, it is necessary to detect the actual hold-position of the electronic component 30 as held by the component holder 50, and adjust movement data of the component-mounting head 32 for compensation for an error of the detected actual hold-position with respect to the nominal position, before the component-mounting head 32 is moved to mount the electronic component 30 on the substrate 36, according to the movement data. To this end, a first image-taking device 52 operable to take an image of the electronic component 30 as held by the component holder 50 is fixedly disposed on the frame 12, more specifically, at a portion of the frame 12 which is less likely to suffer from thermal expansion due to a temperature rise, than the other portion. For example, the first image-taking device 52 includes a CCD camera. The first image-taking device 52 is arranged to take the image of the electronic component 30 located at a predetermined component imaging position. That is, the image of the electronic component 30 as held by the component holder 50 is taken by the first image-taking device 52 when the component-mounting head 32 is located at the component imaging position, as shown in FIG. 3.

The position of the component-mounting head 32 of each component-mounting robot 22 is inevitably influenced by the thermal expansion of the electronic-component mounting system 10. In view of this, the component-mounting head 32 is provided with a thermal-expansion detecting mark 54 for detecting the amount of thermal expansion of the system 10. The detecting mark 54 is moved with the component-holding head 32. An image of the thermal-expansion detecting mark 54 is taken by the first image-taking device 52, when the component-mounting head 32 is located at a predetermined thermal-expansion-detecting-mark imaging position.

Figure 4:
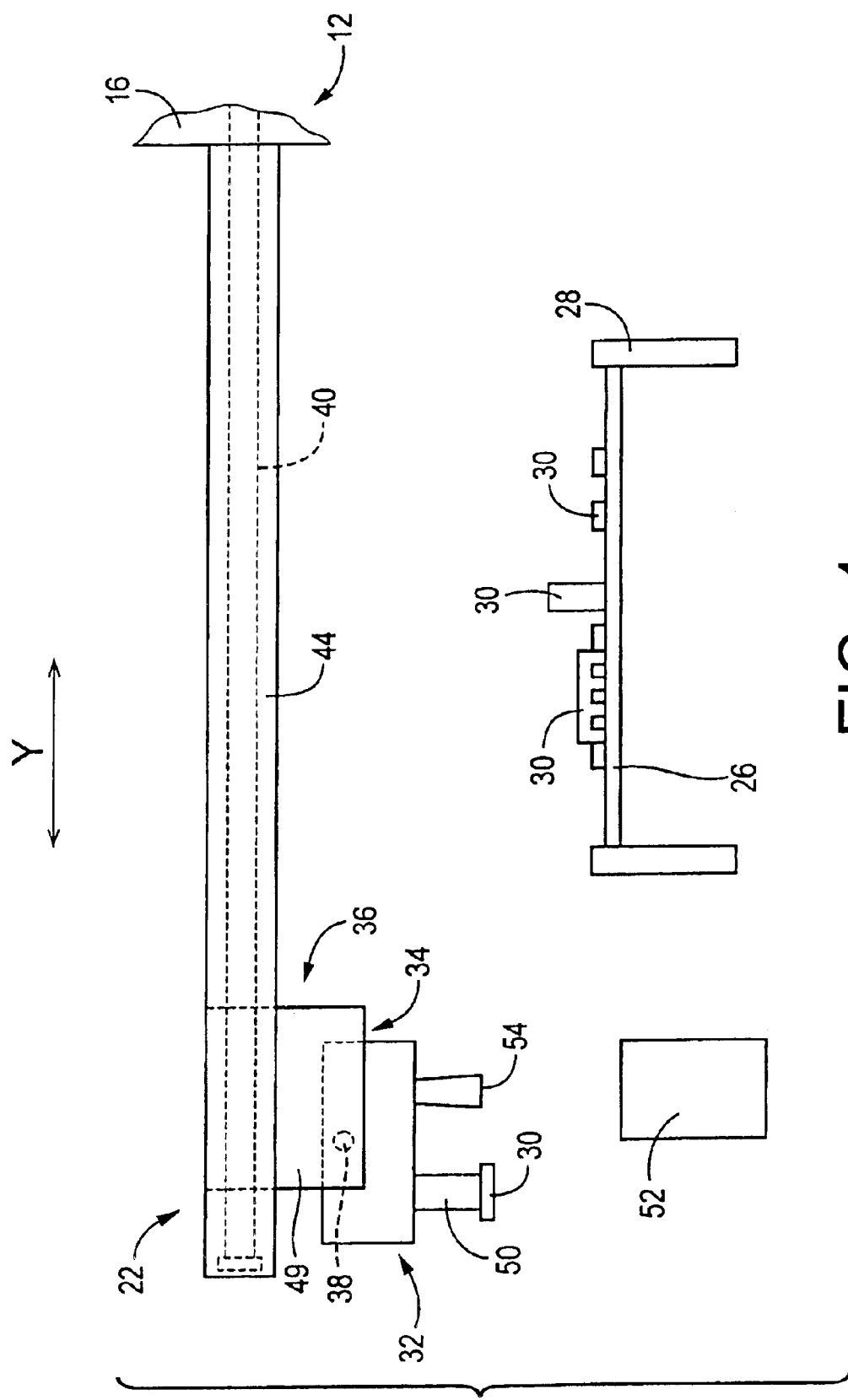
FIG. 4 is a side elevational view showing the Y-axis positioning device 36 located at an imaging position to take an image of a thermal-expansion detecting mark, in the component-mounting robot 22 of FIG. 1, together with the first image-taking device 52.

The image of the thermal-expansion detecting mark 54 is taken by the first image-taking device 52, to detect the amount of thermal expansion of the frame 12 in the X-axis direction, at the proximal end of the Y-axis ballscrew 40 (at which the ballscrew 40 is supported by the back wall 16), and the amount of thermal expansion of the Y-axis ballscrew 40 in the Y-axis direction, at the Y-axis position corresponding to the thermal-expansion-detecting-mark imaging position. Referring to FIG. 4, there is shown the component-mounting head 32 located at the thermal-expansion-detecting-mark imaging position at which the thermal-expansion detecting mark 54 is aligned with the first image-taking device 52 in the XY plane. The thermal-expansion-detecting-mark imaging position is spaced a predetermined distance from the proximal end of the Y-axis ballscrew 40 in the Y-axis direction, such that the nominal mounting position of the electronic component 30 on the substrate 26 is located intermediate between the above-indicated proximal end and the thermal-expansion-detecting-mark imaging position in the Y-axis direction.

Figure 5:
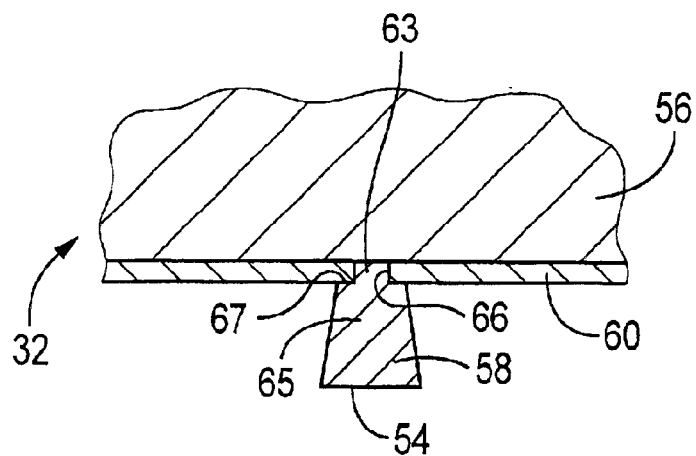
FIG. 5 is a side elevational view showing a portion of a component-mounting head 32 of FIG. 3, on which a thermal-expansion detecting mark 54 is provided.

Referring to the side elevational view of FIG. 5, there is shown in cross section an arrangement of the component-mounting head 32 to hold the thermal-expansion detecting mark 54. The component-mounting head 32 includes a main body 56 having a horizontally extending lower surface, and a projecting member 58 in the form of a tapered rod extending downwards from the lower surface of the main body 56. The projecting member 58, which is a member formed separately from the main body 56, has opposite end portions having different diameters, and is attached at its smaller-diameter end portion to the main body 56. The thermal-expansion detecting mark 54 is fixedly provided on the end face of the larger-diameter end portion of the projecting member 58, and is formed of a material which is likely to absorb incident light and less likely to reflect the incident light.

Figure 6:
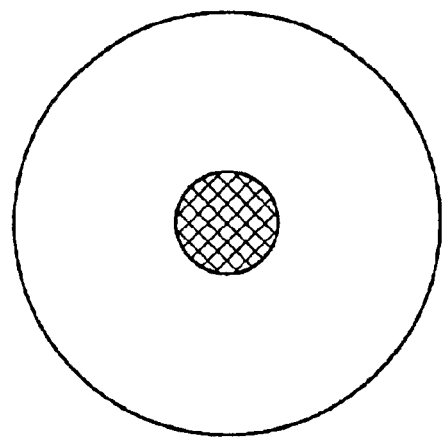
FIG. 6 is a view showing an image of the thermal-expansion detecting mark 54 taken by the first image-taking device 52.

The lower surface of the main body 56 is covered by a planar element in the form of a surface-light-emitting sheet 60 which emits a background light for the thermal-expansion detecting mark 54. This surface-light-emitting sheet 60 functions to aid the first image-taking device to obtain a clear image of the outer profile or periphery of the thermal-expansion detecting mark 54. FIG. 6 shows an image of the thermal-expansion detecting mark 54 taken by the first image-taking device 52, where the camera of the device 52 has a circular imaging area or field of vision.

The clarity of the image of the thermal-expansion detecting mark 54 as taken by the first image-taking device 52 is increased by positioning the thermal-expansion detecting mark 54 at the focal point of the first image-taking device 52 (at substantially the same position as the electronic component 30 as held by the component holder 50), as well as by providing the surface-light-emitting sheet 60 in the background of the detecting mark 54, as described above. Owing to this mechanical or physical arrangement of the detecting mark 54 (object to be imaged) and the surface-light-emitting sheet 60, a contrast between the image of the thermal-expansion detecting mark 54 and the image of the background is effectively increased, making it possible to increase the clarify of the periphery of the image of the detecting mark 54 as taken by the first image-taking device 52.

The clarify of the image of the thermal-expansion detecting mark 54 is further increased by the tapered configuration of the projecting member 58.

Figure 7:
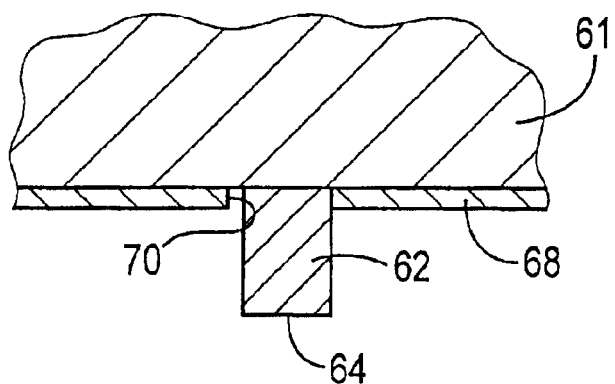
FIG. 7 is a side elevational view showing a modification of the portion of the component-mounting head 32 of FIG. 5, on which a thermal-expansion detecting mark 64 is provided.

Referring to FIG. 7, there is shown a comparative example in the form of a projecting member 62 which has a constant diameter over its entire length. In this case, a dimensional error or variation of the projecting member 62 during its manufacture, or a positioning error of the projecting member 62 upon its attachment to a main body 61 may cause the first image-taking device 52 to take an image of the periphery of the proximal end portion of the projecting member 62, in addition to an image of a thermal-expansion detecting mark 64 provided on the distal end face of the projecting member 62, so that the clarify of the periphery of the detecting mark 64 in the image taken by the first image-taking device 52 is reduced, resulting in deterioration of the detecting accuracy of the amount of thermal expansion of the system 10.

In the present embodiment, on the other hand, the projecting member 58 consists of a proximal end part 63 surrounded by the surface-light-emitting sheet 60, and a projecting part 65 which is tapered, as shown in FIG. 5, such that the distal end of the projecting part 65 located closer to the first image-taking device 54 has a larger diameter than the proximal end remote from the first image-taking device 54, so that the outer profile or periphery of the distal end of the projecting part 65 on which the thermal-expansion detecting mark 54 is provided is located radially outwardly of the periphery of the proximal end of the projecting part 65, in the projection image taken by the first image-taking device 52. Accordingly, the clarify of the periphery of the detecting mark 54 in the projection image taken by the first image-taking device 52 is not influenced by the periphery of the proximal end of the projecting part 65.

Thus, the tapered configuration of the projecting member 58 is effective to increase the clarify of the image of the thermal-expansion detecting mark 54 taken by the first image-taking device 52.

Further, the surface-light-emitting sheet 60 provided in the present embodiment has a through-hole 66 in which there is fitted the above-indicated proximal end part 63 of the projecting member 58, which proximal end part 63 is a portion of the projecting member 58 other than the projecting part 65 and has a smaller diameter than the projecting part 65. The projecting member 58 is attached to the body 56 of the component-mounting head 32 such that a shoulder surface 67 formed between the proximal end part 63 and the projecting part 65 is held in abutting contact with a portion of the surface-light-emitting sheet 60 in which there is formed the through-hole 66.

In the present embodiment, an image of the periphery of the shoulder surface 67 will not undesirably be taken by the first image-taking device 52, even if the through-hole 66 has a dimensional error.

Figure 8:
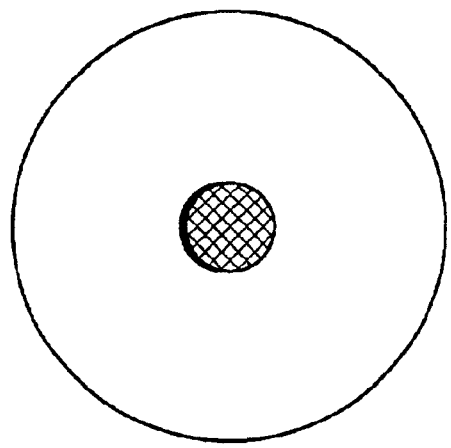
FIG. 8 is a view showing an image of the thermal-expansion detecting mark 64 taken by the first image-taking device 52.

In the comparative example of FIG. 7 in which the projecting member 62 has a constant diameter over its entire length, there may be a considerably large gap between a through-hole 70 formed through a surface-light-emitting sheet 68 and the outer circumferential surface of the proximal end portion of the projecting member 62, if the through-hole 70 has a larger diameter than the nominal value, due to an error during the manufacture of the sheet 68. This gap reduces the clarify of the periphery of the thermal-expansion detecting mark 64 in the image taken by the first image-taking device 52, as indicated in FIG. 8.

In the present embodiment, a dimensional error of the through-hole 66 or the proximal end part 63 will not reduce the clarify of the periphery of the thermal-expansion detecting mark 54 in the image taken by the first image-taking device 52, owing to the shoulder surface 67 held in contact with the surface-light-emitting sheet 60, as well as the tapered configuration of the projecting member 58 having the thermal-expansion detecting mark 54 at the larger distal end on the side of the first image-taking device 52.

It is also noted that the projecting member 58 which carries the thermal-expansion detecting mark 54 has a circular cross sectional shape, so that the projecting member 58 need not be positioned in the circumferential direction. Namely, the angular position of the projecting member 58 and the detecting mark 54 with respect to the first image-taking device 52 will not influence the image of the detecting mark 54 taken by the first image-taking device 52.

Figure 9A:
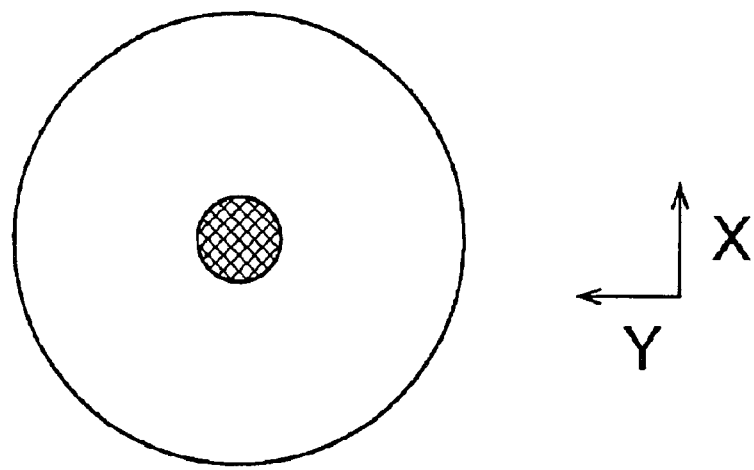
FIG. 9A is a view showing an image of the thermal-expansion detecting mark 54 of FIG. 4 taken by the first image-taking device 52, where the electric-component mounting system 10 of FIG. 1 does not have thermal expansion.
Figure 9B:
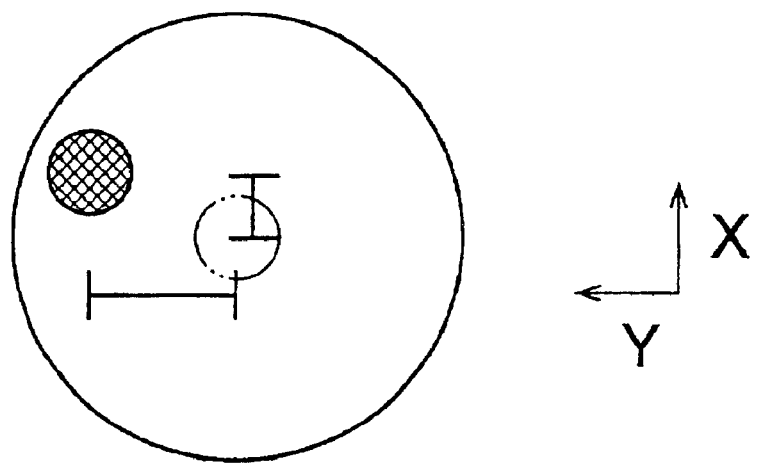
FIG. 9B is a view showing an image of the thermal-expansion detecting mark 54 taken by the first image-taking device 52, where the electric-component mounting system 10 has thermal expansion.

FIG. 9A shows an image of the thermal-expansion detecting mark 54 (indicated by a cross-hatched circle) taken by the first image-taking device 52 when the position of the component-mounting head 32 is not substantially influenced by the thermal expansion, while FIG. 9B shows an image of the thermal-expansion detecting mark 54 taken by the first image-taking device 52 when the position of the component-mounting head 32 is influenced by the thermal expansion in both of the X-axis and Y-axis directions. In these cases of FIGS. 9A and 9B, the first image-taking device 52 has a circular imaging area or field of vision. In FIG. 9B, two-dot chain line indicates the image of the thermal-expansion detecting mark 54 at the nominal position, that is, when the position of the component-mounting head 32 is not substantially influenced by the thermal expansion. In FIG. 9B, a distance between the centers of the cross-hatched circle and the circle indicated by the two-dot chain line in the X-axis direction represents an amount of thermal expansion of the component-mounting head 32 in the X-axis direction, while a distance between the centers in the Y-axis direction represents an amount of thermal expansion of the head 32 in the Y-axis direction.

While the arrangement of each of the component-mounting robots 22 has been described, there will be described the arrangement of the image-taking robot 24.

As shown in FIG. 1, the image-taking robot 24 includes a movable member 72 which is movable in the XY plane in the X-axis and Y-axis directions. This movable member 72 carries a second image-taking device 74 fixed thereto for taking an image of a fiducial mark provided on the substrate 26. Like the first image-taking device 52, the second image-taking 74 includes a CCD camera.

Figure 10:
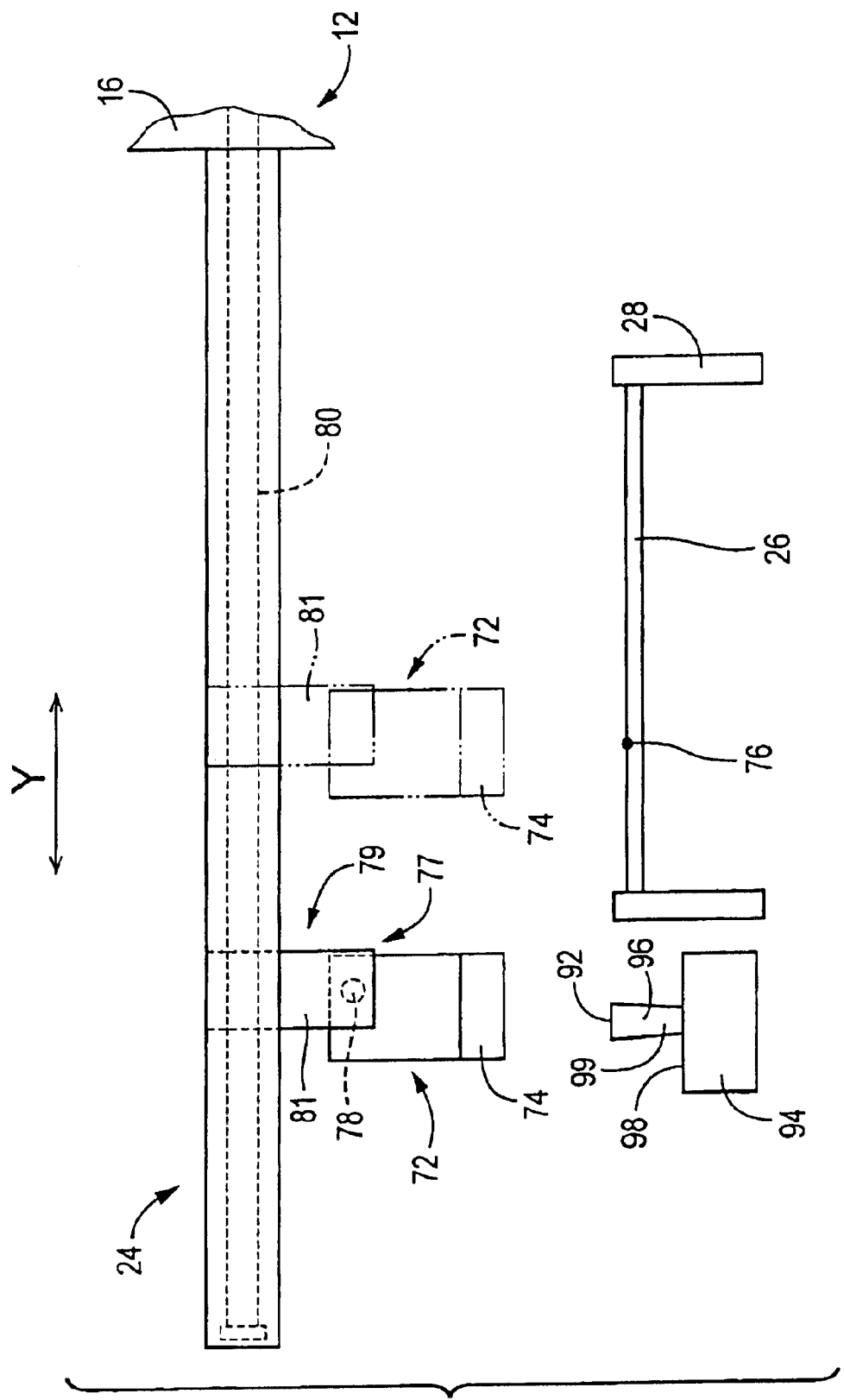
FIG. 10 is a side elevational view showing a Y-axis positioning device 79 located at the imaging position of the thermal-expansion detecting mark, in a component-imaging robot 24 of FIG. 1.

The substrate 26 positioned by the conveyor 28 as shown in FIG. 10 is not necessarily located at the nominal position in the X-axis and Y-axis directions. Accordingly, it is necessary to detect the actual position of the substrate 26, and adjust movement data of each component-mounting head 32 for compensation of an error of the detected actual position with respect to the nominal position. To this end, the fiducial mark 76 is provided on the substrate 26, and the image-taking robot 24 is moved to move the second image-taking device 74 to a predetermined fiducial-mark imaging position at which the second image-taking device 74 takes the image of the fiducial mark 76. Where the substrate 26 is located at the nominal position, the image of the fiducial mark 76 taken by the second image-taking device 74 located at the fiducial-mark imaging position is located at the center of the imaging area of the second image-taking device 74. In FIG. 10, two-dot chain line indicates the second image-taking device 74 located at the fiducial-mark imaging position at which the image of the fiducial mark 76 on the substrate 27 is taken.

As in the component-mounting heads 32, the movable member 72 is moved by ballscrew mechanisms. To this end, the image-taking robot 24 has an X-axis positioning device 77, which includes an X-axis ballscrew 78 and a ballnut (not shown) as the ballscrew mechanism, and an X-axis movable portion in the form of the movable member 72 movable with the ballnut, and an X-axis guide rail 81. The X-axis positioning device 77 further includes an X-axis servomotor 82 (shown in FIG. 11) operable to rotate the X-axis ballscrew 78 or the ballnut. The image-taking robot 24 further has a Y-axis positioning device 79. Like the X-axis positioning device 77, the Y-axis positioning device 79 includes a Y-axis ballscrew 80 and a ballnut (not shown) as the ballscrew mechanism, and a Y-axis movable portion in the form of the X-axis guide rail 81, and a Y-axis guide rail. The Y-axis positioning device 79 further includes a Y-axis servomotor 84 (shown in FIG. 11) operable to rotate the Y-axis ballscrew 80 or the ballnut. Like the ballscrews 38, 40 of the component-mounting robots 22, each ballscrew 78, 80 is supported at one of its opposite ends.

The position of the movable member 72 of the image-taking device 24 is inevitably influenced by the thermal expansion of the electronic-component mounting system 10. In the present embodiment, a thermal-expansion detecting mark 92 similar to the above-described thermal-expansion detecting mark 54 is provided for the image-taking robot 24, as shown in FIG. 10. The image of the thermal-expansion detecting mark 92 is taken by the second image-taking device 74, to detect the amount of thermal expansion of the frame 12 in the X-axis direction, at the proximal end portion of the Y-axis ballscrew 80 (at which the ballscrew 80 is supported by the back wall 16), and the amount of thermal expansion of the Y-axis ballscrew 80 in the Y-axis direction, at the Y-axis position corresponding to a thermal-expansion-detecting-mark imaging position of the second image-taking device 74.

As shown in FIG. 10, the thermal-expansion detecting mark 92 is provided on an end face of a projecting member 96 which extends upwards from an upper surface of a main body 94, unlike the thermal-expansion detecting mark 54 provided at the end face of the projecting member 58. The upper surface of the main body 94 is covered by a surface-light-emitting sheet 98, and a projecting part 99 of the projecting member 96 is tapered such that the projecting part 99 has the largest diameter at its distal end at which the detecting mark 92 is provided. Like the surface-light-emitting sheet 60 has a through-hole (not shown) in which there is fitted a proximal end part (not shown) of the projecting member 92, which is a part other than the projecting part 99. The projecting member 96 is attached at its proximal end portion to the main body 94 such that a shoulder surface formed between the proximal end portion and the proximal end of the projecting part 99 is held in abutting contact with a portion of the sheet 98 which has the through-hole. Each of the surface-light-emitting sheets 60, 98 may be replaced by a surface-light-emitting adhesive-backed layer bonded on the lower surface of the main body 56.

The main body 94 supporting the projecting member 92 having the thermal-expansion detecting mark 92 is located at a position of the frame 12 at which the amount of thermal expansion due to a temperature rise is comparatively small. The image of the thermal-expansion detecting mark 92 is taken by the second image-taking device 74 located at the predetermined thermal-expansion-detecting-mark imaging position at which the second image-taking device 74 is located right above the thermal-expansion detecting mark 92. The thermal-expansion-detecting-mark imaging position of the second image-taking deice 74 is spaced a predetermined distance from the proximal end of the Y-axis ballscrew 80 in the Y-axis direction, such that the fiducial-mark imaging position described above is located intermediate between the proximal end of the Y-axis ballscrew 80 and the thermal-expansion-detecting-mark imaging position in the Y-axis direction. In FIG. 10, solid line indicates the movable member 72 (carrying the second image-taking device 74) located at the thermal-expansion-detecting-mark imaging position at which the second image-taking device 74 is located right above the detecting mark 92.

Figure 11:
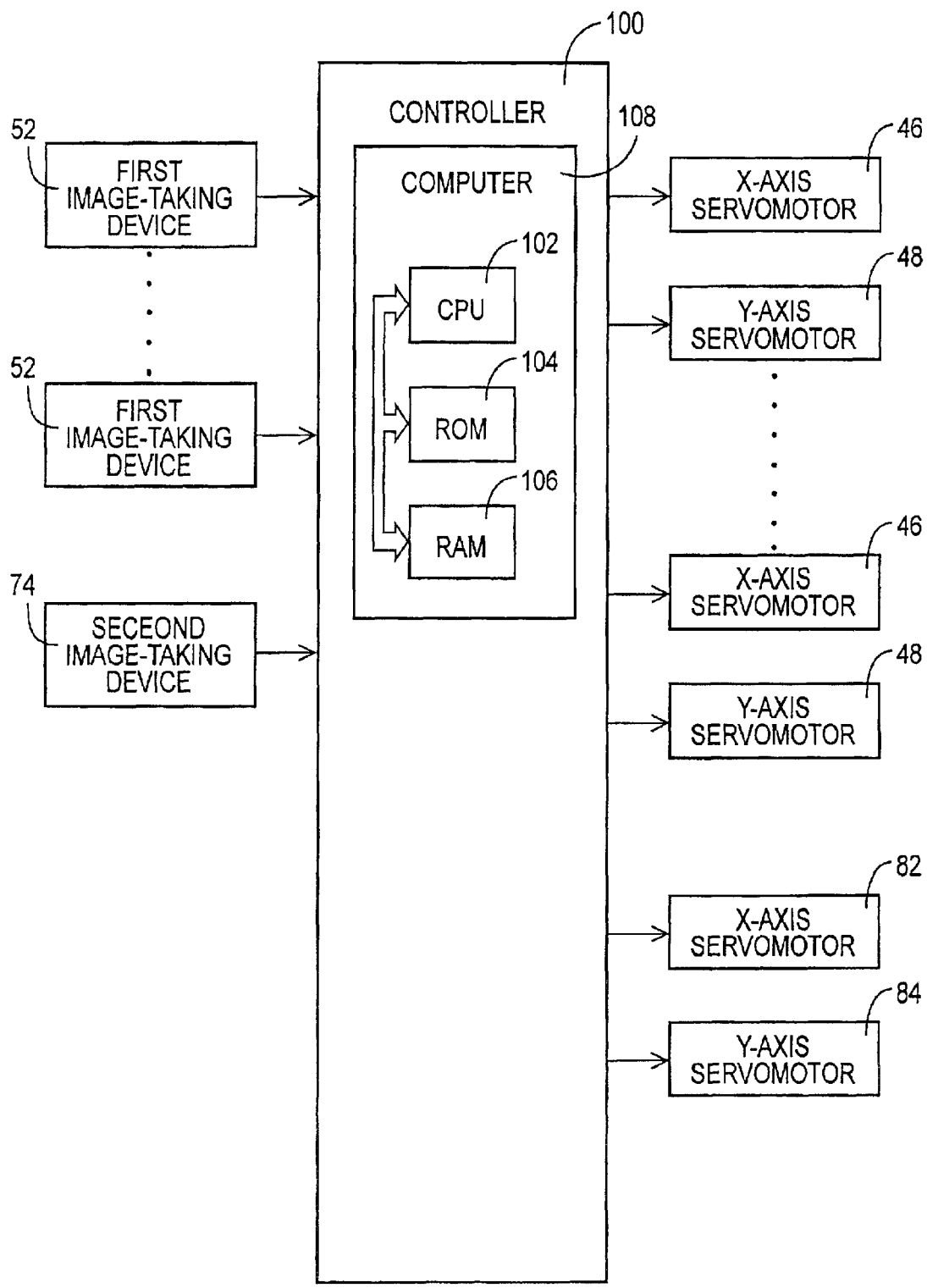
FIG. 11 is a block diagram illustrating an electric arrangement of the electric-component mounting system of FIG. 1.

While the mechanical arrangement of the present electronic-component mounting system 10 has been described above, there will next be described an electric arrangement of the system 10, by reference to FIG. 11.

The electronic-component mounting system 10 is provided with a controller 100, which is principally constituted by a computer 108 incorporating a CPU 102, a ROM 104 and a RAM 106. The controller 100 is connected through an input interface (not shown) to the first image-taking devices 52 of the component-mounting robots 22 and the second image-taking device 74 of the image-taking robot 24. The controller 100 is further connected through an output interface and respective driver circuits to the X-axis servomotors 46 and the Y-axis servomotors 48 of the component-mounting robots 22 and the X-axis servomotor 82 and the Y-axis servomotor 84 of the image-taking robot 24.

Figure 12:
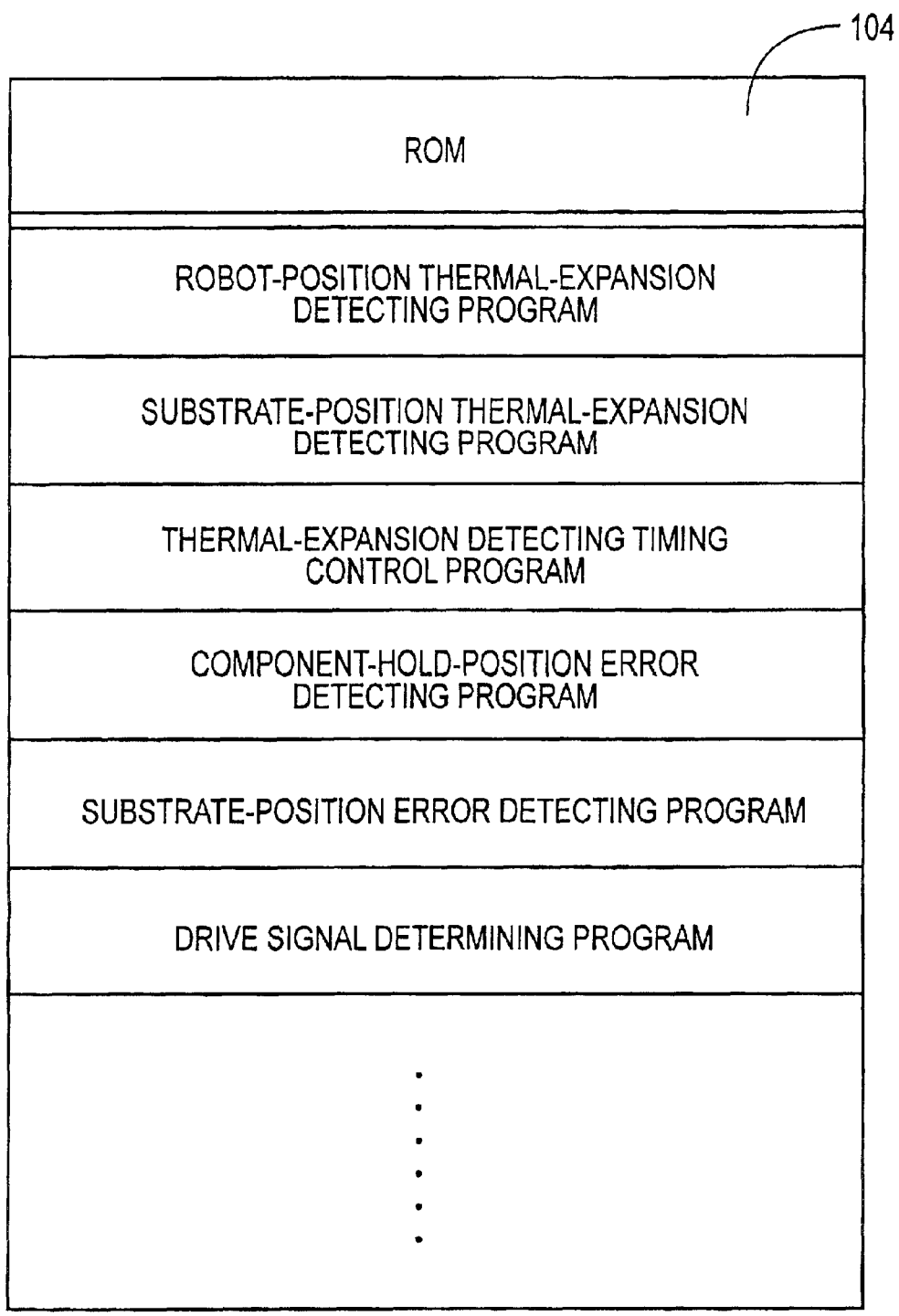
FIG. 12 is a view schematically illustrating an arrangement of a ROM 104 of FIG. 11.
Figure 13:
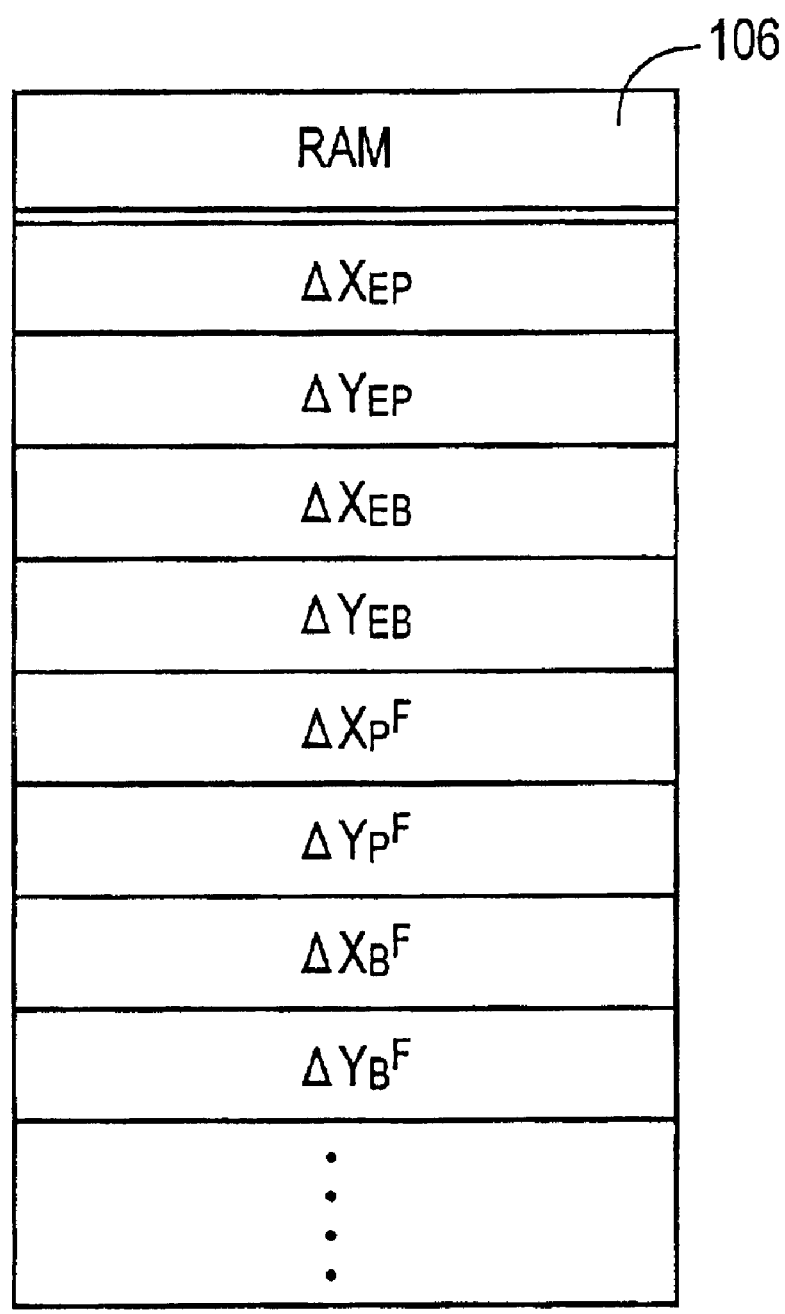
FIG. 13 is a view schematically illustrating an arrangement of a RAM 106 of FIG. 11.

The ROM 104 stores various control programs as shown in FIG. 12, while the RAM 106 has various temporary memory areas as schematically indicated in FIG. 13.

The control programs stored in the ROM 14 include the following programs:

(1) Robot-Position Thermal-Expansion Detecting Program

This program is formulated to process an image of the thermal-expansion detecting mark 54 taken by the first image-taking device 52 of each component-mounting robot 22, for detecting an amount of thermal expansion which influences the position of the component-mounting head 32 (which carries the component holder 50). Described in detail, the robot-position thermal-expansion detecting program is formulated to move the first image-taking device 52 to the predetermined thermal-expansion-detecting-mark imaging position, operate the first image-taking device 52 to take the image of the thermal-expansion detecting mark 54, and calculate robot-position thermal expansion amounts $\Delta X_{EP}$ and $\Delta Y_{EP}$, which are distances of deviation of the position of the image of the detecting mark 54 with respect to the nominal position in the X-axis and Y-axis directions in the imaging area of the first image-taking device 52. On the basis of the calculated robot-position thermal expansion amounts $\Delta X_{EP}$ and $\Delta Y_{EP}$, it is possible to estimate a component of the positioning error of the electronic component 30 as held by the component holder 50, which component is derived from the thermal expansion, and a component of the positioning error of the electronic component 30 as mounted on the substrate 26, which component is derived from the thermal expansion.

(2) Substrate-Position Thermal-Expansion Detecting Program

This program is formulated to process an image of the thermal-expansion detecting mark 92 taken by the second image-taking device 74 of the image-taking robot 24, for detecting an amount of thermal expansion which influences the position of the movable member 72 of the robot 24. Described in detail, the substrate-position thermal-expansion detecting program is formulated to move the second image-taking device 74 to the predetermined thermal-expansion-detecting-mark imaging position, operate the second image-taking device 74 to take the image of the thermal-expansion detecting mark 92, and calculate substrate-position thermal expansion amounts $\Delta X_{EB}$ and $\Delta Y_{EB}$, which are distances of deviation of the position of the image of the detecting mark 92 with respect to the nominal position in the X-axis and Y-axis directions in the imaging area of the second image-taking device 74. On the basis of the calculated substrate-position thermal expansion amounts $\Delta X_{EB}$ and $\Delta Y_{EB}$, it is possible to estimate a component of the positioning error of the substrate 26 (as detected on the basis of the image taken by the second image-taking device 74) on the conveyor 28, which component is derived from the thermal expansion.

(3) Thermal-Expansion Detecting Timing Control Program

This program is formulated to operate the first and second image-taking devices 52, 74 for taking the images of the thermal-expansion detecting marks 52, 92, at a controlled frequency such that the image-taking devices 52, 74 are operated at a higher frequency in a first time period during which the positioning error derived from the thermal expansion changes at a relatively high rate, than in a second time period during which the positioning error derived from the thermal expansion changes at a relatively low rate. An example of the first time period is an initial portion of a production run of the system 10 which is started after a relatively long time of rest or stopping. An example of the second time period is a period of a production run of the system 10 which has been continued for a relatively long time.

(4) Component-Hold-Position Error Detecting Program

This program is formulated to operate the first image-taking device 52 to take an image of the electronic component 30 as held by the component holder 50, and process the image, for detecting the positioning error of the electronic component 30 as held by the component holder 50. This positioning error includes a component (hold-position error) due to an error of the actual position of the electronic component 30 as held by the component holder 50 with respect to the nominal position, and a component (thermal-expansion positioning error) due to an error of the actual position of the component holder 50 with respect to the nominal position in the electronic-component mounting system 10, which error is derived from the thermal expansion of the system 10. Described in detail, the component-hold-position error detecting program is formulated to operate the first image-taking device 52 of each component-mounting robot 22 to take the image of the electronic component 30 as held by the component holder 50, and process the image for calculating component-hold-position error amounts $\Delta X_P$ and $\Delta Y_P$ of the electronic component 30 as held on each component-mounting head 32, in the X-axis and Y-axis directions.

(5) Substrate-Position Error Detecting Program

This program is formulated to operate the second image-taking device 74 to take an image of the fiducial mark 76 on the substrate 26, and process the image for detecting the positioning error of the substrate 26 on the conveyor 28. This positioning error includes a component (hold-position error) due to an error of the actual position of the substrate 26 with respect to the nominal position in the electronic-component mounting system 10, and a component (thermal-expansion positioning error) derived from the thermal expansion of the system 10 which prevents accurate detection of the actual position of the substrate 26 on the basis of the image taken by the second image-taking device 74. Described in detail, the substrate-position error detecting program is formulated to operate the second image-taking device 74 to take the image of the fiducial mark 76, and process the image for calculating substrate-position error amounts $\Delta X_B$ and $\Delta Y_B$ of the substrate 26 in the X-axis and Y-axis direction of the movable member 72 of the image-taking robot 24.

(6) Drive-Signal Determining Program

This program is formulated to determine drive signals to be applied to the X-axis and Y-axis servomotors 46, 48 for moving each component-mounting head 32 for locating the electronic component 30 exactly at the target or nominal mounting position on the substrate 26. Described in detail, the drive-signal determining program is formulated to determine the X-axis and Y-axis drive signals to be applied to the respective X-axis and Y-axis servomotors 46, 48, on the basis of various sets of data obtained according to the robot-position thermal-expansion detecting program, the substrate-position thermal-expansion detecting program, the component-hold-position error detecting program and the substrate-position error detecting program, which have been described. With the servomotors 46, 48 operated according to the thus determined X-axis and Y-axis drive signals, the actual position of the electronic component 30 as mounted on the substrate 26 from the component-mounting head 32 is substantially aligned with the target or nominal mounting position, irrespective of the thermal expansion of the electronic-component mounting system 10, the positioning error of the electronic component 30 as held by the component holder 50, and the positioning error of the substrate 26 as positioned by the conveyor 28.

While the control programs which have been briefly described will be described in detail by reference to the flow charts 16–21, a manner of detecting the thermal expansion will be described prior to the detailed description of those control programs.

In the present embodiment, the amounts of the thermal expansion in the X-axis and Y-axis directions are detected for each of the robots 22, 24.

Referring back to FIG. 1, the frame 12 of the system 10 extends in the X-axis direction, and the Y-axis ballscrews 40 of the robots 22 and the Y-axis ballscrew 80 of the robot 24 which extend in the Y-axis direction are supported by the frame 12 such that these ballscrews 40, 80 are arranged in a spaced-apart relationship with each other in the X-axis direction. In the present electronic-component mounting system 10, the X-axis ballscrews 38, 78 corresponding to the Y-axis ballscrews 40, 80 are disposed so as to extend in the X-axis direction. In the present system 10, the overall X-axis thermal expansion which influences the X-axis position of the X-axis movable portion (component-mounting head 32 of each component-mounting robot 22, or the movable member 72 of the image-taking robot 24) includes a component consisting of the thermal expansion of the frame 12 at the proximal end of the Y-axis ballscrew 40, 80 (at which the ballscrew 40, 80 is supported by the back wall 16), and a component consisting of the thermal expansion of the X-axis ballscrew 38, 78.

In the present embodiment wherein the lengths of the X-axis ballscrews 38, 78 are shorter than those of the corresponding Y-axis ballscrews 40, 80, the thermal expansion of the X-axis ballscrews 38, 78 are ignored in detecting the amount of the overall X-axis thermal expansion. In other words, only the amount of the thermal expansion of the frame 12 is detected as the overall X-axis thermal expansion. This thermal expansion amount in the X-axis direction may be detected at a given position of the Y-axis ballscrew 40, 80 which is directly supported at its proximal end by the frame 12 (back wall 16), or at a given position of the X-axis ballscrew 38, 78 which is indirectly supported by the frame 12 via the support structure for the Y-axis ballscrew 40, 80.

In the present embodiment, therefore, the overall X-axis thermal expansion is detected as the robot-position thermal expansion amount $\Delta X_{EP}$ of each component-mounting robot 22 or the substrate-position thermal expansion amount $\Delta X_{EB}$ of the image-taking robot 24), on the basis of the image of the thermal-expansion detecting mark 54 provided on the X-axis movable portion in the form of the component-mounting head 32, or on the image of the thermal-expansion detecting mark 92 taken by the second image-taking device 74 provided on the X-axis movable portion in the form of the movable member 72.

On the other hand, the overall Y-axis thermal expansion which influences the Y-axis position of the X-axis movable portion (component-mounting head 32 or movable member 72) consists principally of the thermal expansion of the Y-axis ballscrew 40, 80.

The thermal expansion of the Y-axis ballscrew 40, 80 is not constant over its entire length, but varies at different axial positions of the Y-axis ballscrew 40, 80. For accurate detection of the thermal expansion of the Y-axis ballscrew 40, 80, the axial position at which the amount of the thermal expansion (robot-position thermal expansion amount $\Delta Y_{EP}$ of each component-mounting robot 22 or substrate-position thermal expansion amount $\Delta Y_{EB}$ of the image-taking robot 24) is detected must be known. This axial position is represented by a distance of this axial position from the proximal end of the Y-axis ballscrew 40, 80 at which the ballscrew 40, 80 is supported by the frame 12 (back wall 16).

Figure 14:
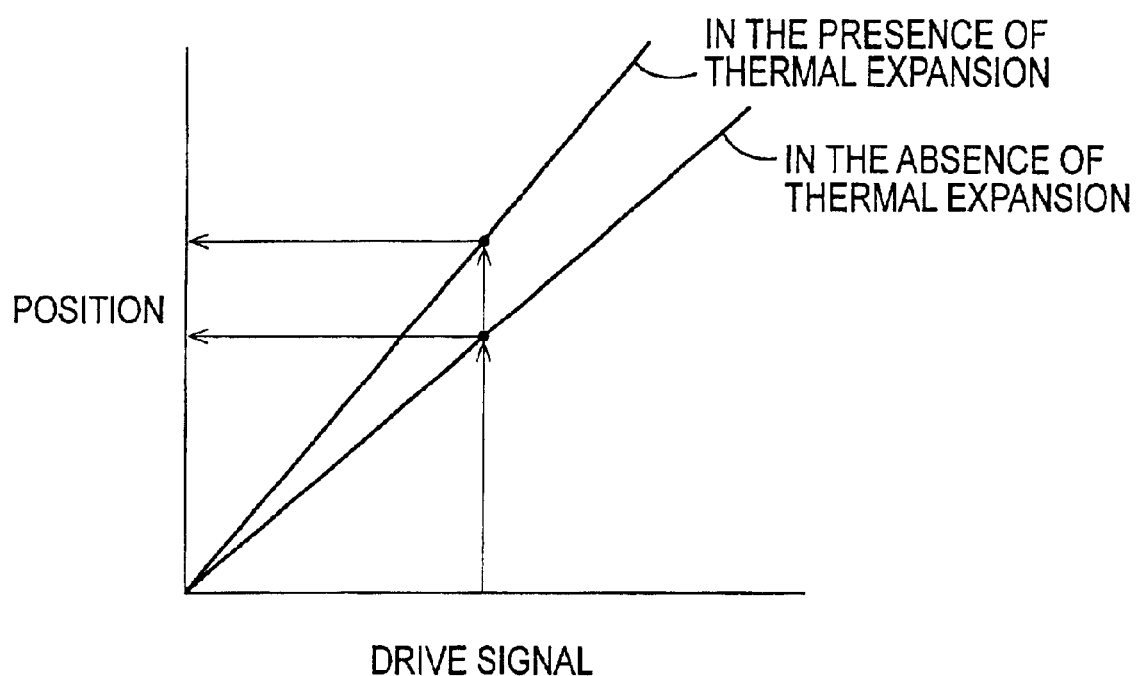
FIG. 14 is a graph for explaining a principle of solving a problem of thermal expansion in the electric-component mounting system 10 of FIG. 1.

The graph of FIG. 14 indicates two relationships between a drive signal to be applied to the Y-axis servomotor 48, 84 of each robot 22, 24 and the Y-axis position to which the X-axis movable portion (component-mounting head 32 or movable member 72) is moved by the Y-axis servomotor 48, 84. One of the relationships is established where the Y-axis ballscrew 40, 80 does not have thermal expansion, while the other relationship is established where the Y-axis ballscrew 40, 80 has thermal expansion. It will be understood from these relationships that the Y-axis position of the X-axis movable portion changes with the amount of the thermal expansion, even when the same drive signal is applied to the Y-axis servomotor 48, 84, for instance, the same number of drive pulses are applied to the Y-axis servomotor. That is, the Y-axis position changes with a change in the thermal expansion amount.

The relationship shown in FIG. 14 where the Y-axis ballscrew 40, 80 has thermal expansion is based on two assumptions, that is, a first assumption that the amount of thermal expansion at the proximal end of the Y-axis ballscrew 40, 80 is zero, and a second assumption that the amount of thermal expansion of the Y-axis ballscrew 40, 80 at a given axial position thereof is proportionally increased with a distance of that axial position from the proximal end of the ballscrew 40, 80.

Referring to the graph of FIG. 15, there will be explained a manner of determining the drive signal to be applied to the Y-axis servomotor 48 of each component-mounting robot 22, on the basis of the thermal expansion amount detected at the thermal-expansion-detecting-mark imaging position, on the two assumptions described above. For easier explanation, it is further assumed that the positioning error of the substrate 26 on the conveyor 28 and the positioning error of the electronic component 30 as held by the component holder 50 are both zero. Two relationships of FIG. 15 between the drive signal and the Y-axis position correspond to the respective two relationships of FIG. 14.

Figure 15:
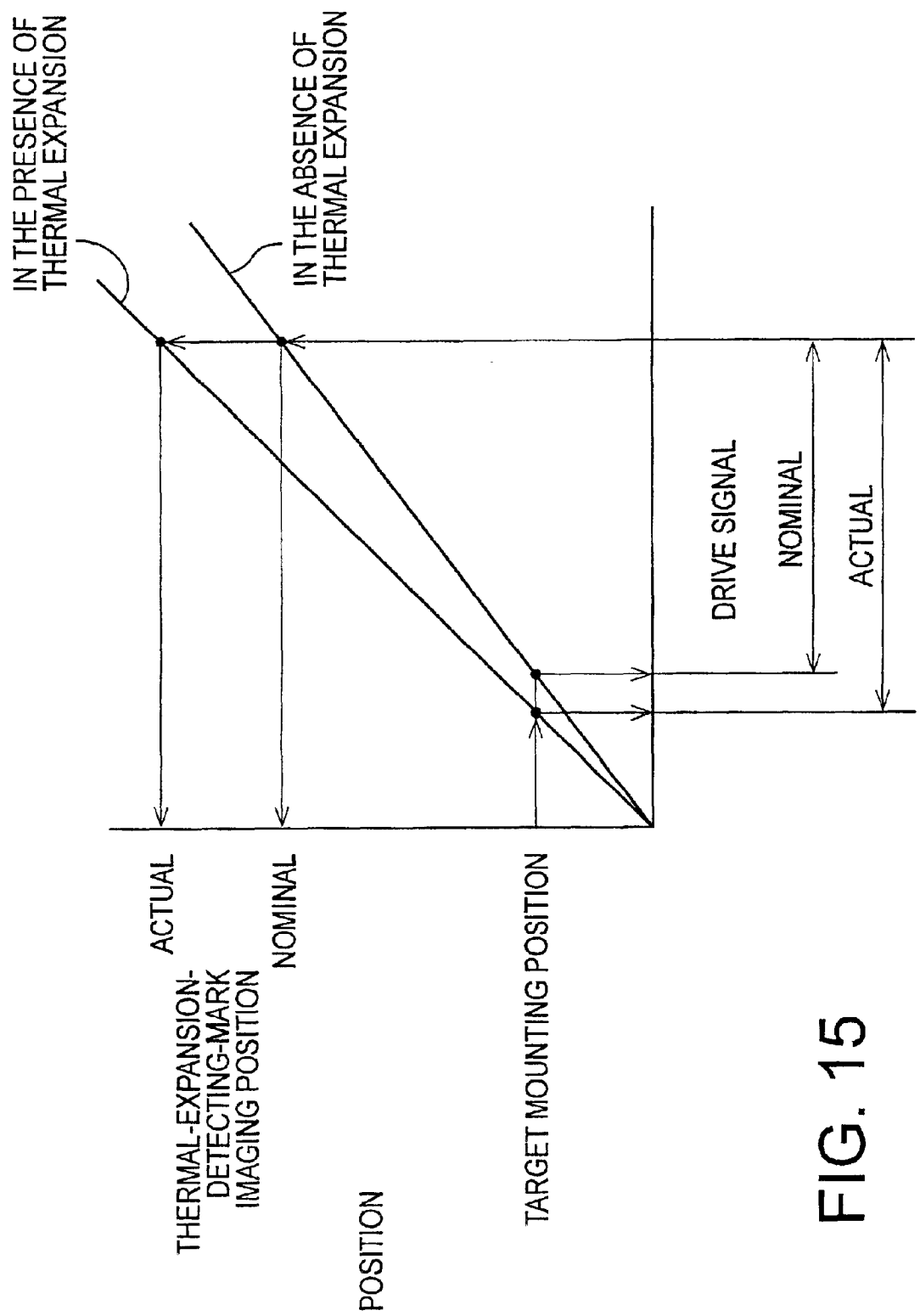
FIG. 15 is graph for explaining a principle of solving a problem of thermal expansion in the electric-component mounting system 10 of FIG. 1.

In the presence of thermal expansion detected at the thermal-expansion-detecting-mark imaging position, the relationship between the drive signal and the Y-axis position of the component-mounting head 32 (component holder 50) can be established, as indicated in FIG. 15, on the two assumptions indicated above. The target or nominal mounting position at which the component-mounting head 32 mounts the electronic component 30 onto the substrate 26 is indicated by a horizontal straight line. A point of intersection of this horizontal straight line and a straight line representing the above-indicated relationship in the presence of the thermal expansion represents the drive signal required to operate the Y-axis servomotor 48 for moving the component-mounting head 32 to the target mounting position.

Accordingly, it is possible to determine the drive signal required to operate the Y-axis servomotor 48 for moving the component-mounting head 32 from the thermal-expansion-detecting-mark imaging position to the target or nominal mounting position, on the basis of the amount of thermal expansion of the Y-axis ballscrew 40 detected at the thermal-expansion-detecting-mark imaging position. In the absence of thermal expansion of the Y-axis ballscrew 40, the nominal drive signal is applied to the Y-axis servomotor 48 so that the component-mounting head 32 is moved from the thermal-expansion-detecting-mark imaging position to the target or nominal mounting position. In the presence of thermal expansion of the Y-axis ballscrew 40, the nominal drive signal should be compensated for the detected amount of the thermal expansion, to obtain the actual drive signal that should be applied to the Y-axis servomotor 48 to move the head 32 to the target mounting position.

Referring to the flow charts of FIGS. 16–21, the six control programs briefly described above will be described in detail.

Figure 16:
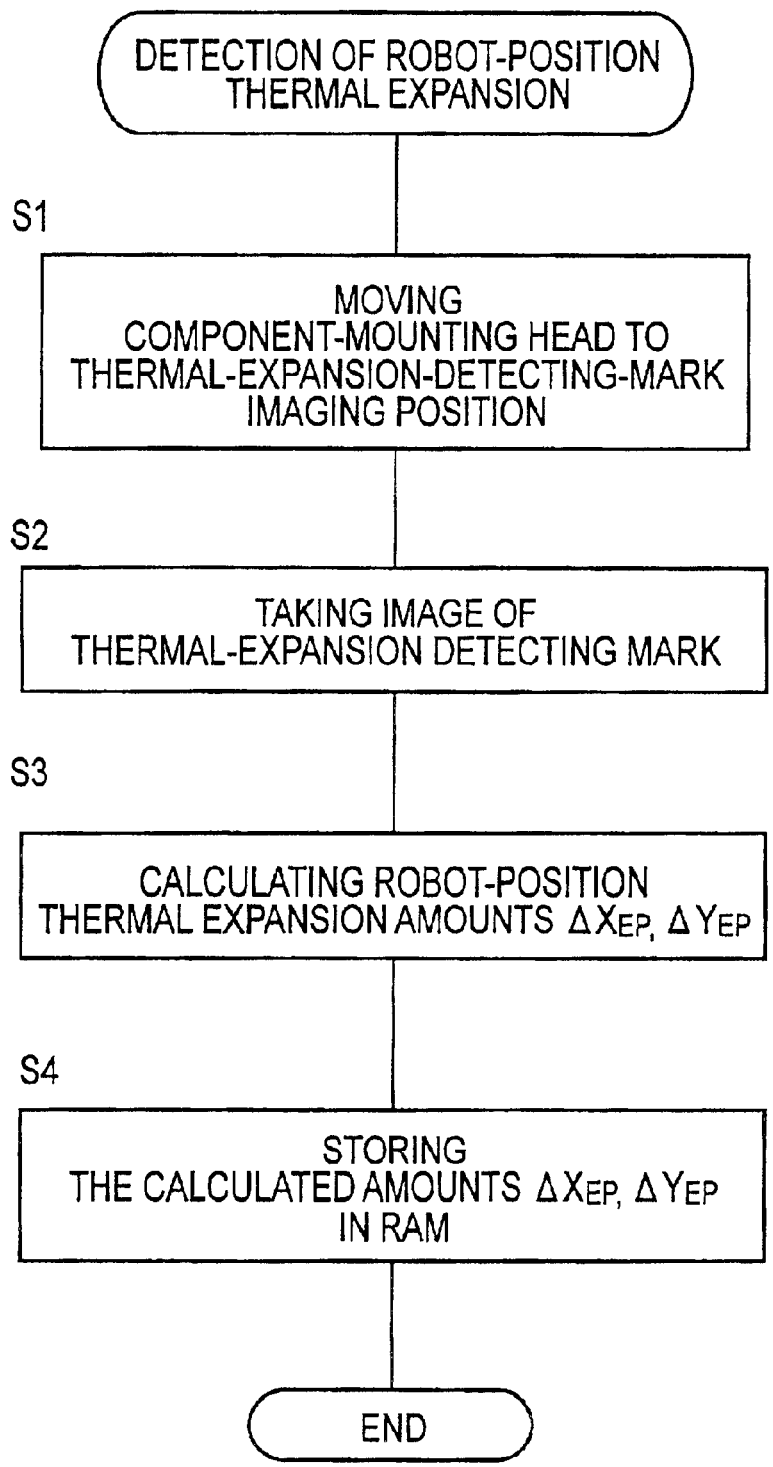
FIG. 16 is a flow chart schematically illustrating a robot-position thermal-expansion detecting program of FIG. 12.

The robot-position thermal-expansion detecting program is schematically illustrated in the flow chart of FIG. 16. This program, which is executed by the computer 108, is initiated upon generation of a start command as a result of execution of the thermal-expansion detecting timing control program described below, after the initiation of an operation of the present electronic-component mounting system 10. While the robot-position thermal-expansion detecting program of FIG. 16 is executed for each of the component-mounting robots 22, the program for one of the robots 22 will be described in the interest of brevity and simplification.

The program of FIG. 16 is initiated with step S1 in which predetermined drive signals are applied to the X-axis and Y-axis servomotors 46, 48 to move the component-mounting head 32 together with the thermal-expansion detecting mark 54 to the thermal-expansion-detecting-mark imaging position at which the thermal-expansion detecting mark 54 is substantially aligned with the first image-taking device 52 in the XY plane. These drive signals are determined such that the thermal-expansion detecting mark 54 is exactly located at the center of the imaging area or field of vision of the first image-taking device 52, if the electronic-component mounting system 10 does not have thermal expansion.

Then, the control flow goes to step S2 to operate the first image-taking device 52 to take an image of the thermal-expansion detecting mark 54. Step S3 is then implemented to calculate distances of deviation of the position of the image of the detecting mark 54 with respect to its nominal position in the X-axis direction and the Y-axis direction, as the robot-position thermal-expansion amounts $\Delta X_{EP}$ and $\Delta Y_{EP}$ in the respective X-axis and Y-axis directions.

Then, the control flow goes to step S4 to store the calculated robot-position thermal-expansion amounts $\Delta X_{EP}$ and $\Delta Y_{EP}$ in the RAM 106. Thus, one cycle of execution of the robot-position thermal-expansion detecting program is terminated.

Figure 17:
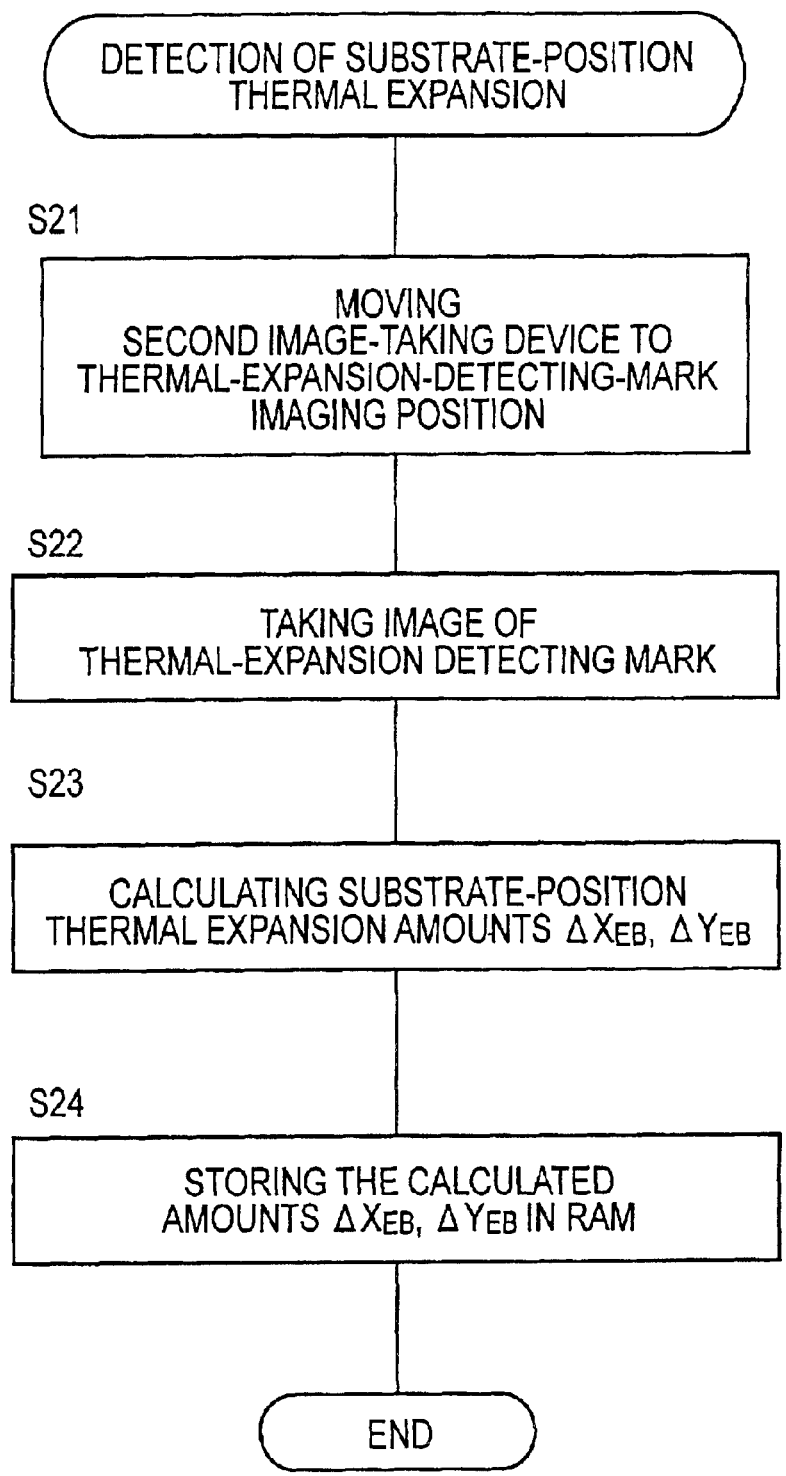
FIG. 17 is a flow chart schematically illustrating a substrate-position thermal expansion detecting program of FIG. 12.

The substrate-position thermal-expansion detecting program is schematically illustrated in the flow chart of FIG. 17. Like the robot-position thermal-expansion detecting program, this program is initiated upon generation of the start command as a result of execution of the thermal-expansion detecting timing control program described below, after the initiation of the operation of the present electronic-component mounting system 10. Unlike the robot-position thermal-expansion detecting program of FIG. 16, the substrate-position thermal-expansion detecting program of FIG. 17 is executed for the image-taking robot 24.

The program of FIG. 17 is initiated with step S21 in which predetermined drive signals are applied to the X-axis and Y-axis servomotors 82, 84 to move the movable member 72 together with the second image-taking device 74 to the thermal-expansion-detecting-mark imaging position at which the second image-taking device 74 is substantially aligned with the thermal-expansion detecting mark 92 in the XY plane. These drive signals are determined such that the thermal-expansion detecting mark 92 is exactly located at the center of the imaging area or field of vision of the second image-taking device 74, if the electronic-component mounting system 10 does not have thermal expansion.

Then, the control flow goes to step S22 to operate the second image-taking device 74 to take an image of the thermal-expansion detecting mark 92. Step S23 is then implemented to calculate distances of deviation of the position of the image of the detecting mark 92 with respect to its nominal position in the X-axis direction and the Y-axis direction, as the substrate-position thermal-expansion amounts $\Delta X_{EB}$ and $\Delta Y_{EB}$ in the respective X-axis and Y-axis directions.

Then, the control flow goes to step S24 to store the calculated robot-position thermal-expansion amounts $\Delta X_{EB}$ and $\Delta Y_{EB}$ in the RAM 106. Thus, one cycle of execution of the substrate-position thermal-expansion detecting program is terminated.

Figure 18:
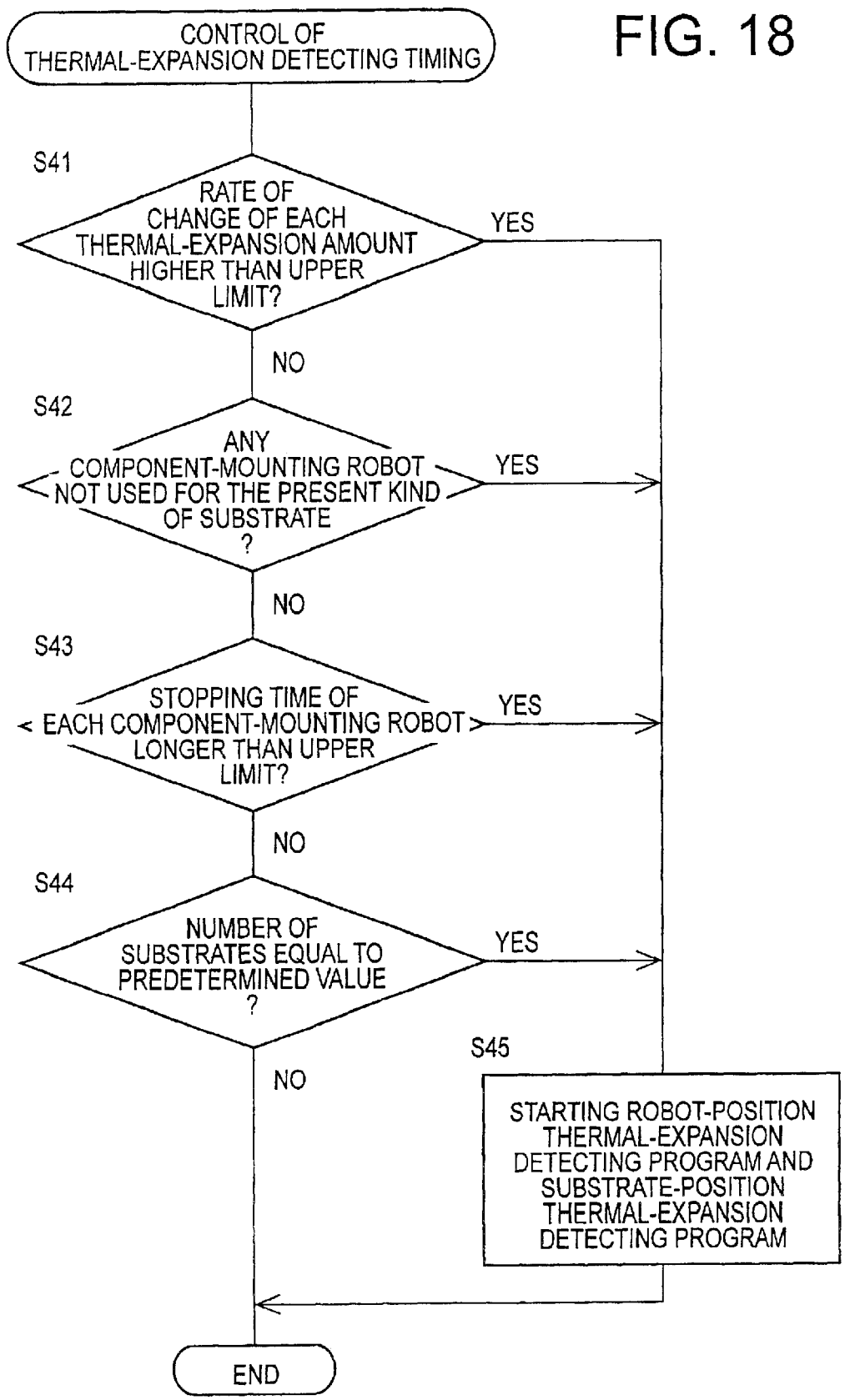
FIG. 18 is a flow chart schematically illustrating a thermal-expansion detecting timing control program of FIG. 12.

The thermal-expansion detecting timing control program is schematically illustrated in the flow chart of FIG. 18. Unlike the two programs described above, this program is initiated each time an operation to mount the electronic components 30 on each substrate 26 is initiated, that is, when each substrate 26 is located at the predetermined position in the transfer path by the conveyor 28, before initiation of the operation to mount the electronic components 30 on this substrate 26.

The program of FIG. 18 is initiated with step S41 to determine whether the rate of change of the amount of thermal expansion which influences each robot 22, 24 is higher than a predetermined upper limit. Described in detail, the last two values of each of the thermal-expansion amounts $\Delta X_{EP}$, $\Delta Y_{EP}$, $\Delta X_{EB}$ and $\Delta Y_{EB}$ are read out from the RAM 106, and absolute values of differences of the last two values of each thermal-expansion amount $\Delta X_{EP}$, $\Delta Y_{EP}$, $\Delta X_{EB}$, $\Delta Y_{EB}$ are obtained. Step S41 is formulated to determine whether the absolute value of any thermal-expansion amount $\Delta X_{EP}$, $\Delta Y_{EP}$, $\Delta X_{EB}$ and $\Delta Y_{EB}$ are is larger than a predetermined value.

If the rate of change of the thermal expansion amount is not higher than the predetermined upper limit during a continuous operation of the component-mounting robots 22 to mount the electronic components 30 on the substrate 26, a negative decision (NO) is obtained in step S41, and the control flow goes to step S42.

Step S42 is implemented to determine whether there is any component-mounting robot 22 not used for the present kind of substrate 26. For some specific kinds of substrate 26, only some of the component-mounting robots 22 that are selected depending upon the specific kind of substrate 26 may be used in an initial period of the component mounting operation on this substrate 26. In this case, the thermal expansion amount which includes each component-mounting robot 22 increases with the time in the initial period of the component mounting operation on each kind of substrate 26, at a specific rate depending upon the specific kind of substrate 26. If any of the component-mounting robots 22 is not used for the present kind of substrate 26, it indicates that there is a relatively high possibility of such increase of the thermal expansion amounts at different rates for the individual robots 22 used for different kinds of substrate 26. Step S42 is implemented to determine whether there is a high possibility of such increase of the thermal expansion amounts.

If all of the component-mounting robots 22 are used to mount the electronic components 30 on the present kind of substrate 26, a negative decision (NO) is obtained in step S42, and the control flow goes to step S43.

Step S43 is implemented to determine whether the stopping time of each component-mounting robot 22 is longer than a predetermined upper limit. During an operation of the electronic-component mounting system 10, the component-mounting robots 22 may be held at rest, for instance, after termination of the component mounting operation on one substrate 26 and before initiation of the component mounting operation on the next substrate 26, that is, until the next substrate 26 is set ready for the component mounting operation. Generally, an increase in the stopping time of each component-mounting robot 22 causes a decrease of the thermal expansion amount, even where the thermal expansion of the system 10 was saturated during the component mounting operation. In view of this fact, step S43 is provided to determine whether there is a relatively high possibility of such decrease of the thermal expansion amount while the component-mounting robot 22 is held at rest.

If the stopping time of any component-mounting robot 22 is not longer than the predetermined upper limit, a negative decision (NO) is obtained in step S43, and the control flow goes to step S44.

Step S44 is provided to determine whether the number of the substrates 26 which have been transferred by the conveyor 28 to the component-mounting position has reached a predetermined value. In the present embodiment, a counter to count the number of the substrates 26 is reset when the number has increased to the predetermined value. Step S44 is provided to detect the thermal expansion amount at a predetermined time interval based on the number of the substrates 26 which have been transferred to the component-mounting position for the component mounting operations.

If the number of the substrates 26 which have been transferred to the component-mounting position is smaller than the predetermined value, a negative decision (NO) is obtained, and one cycle of execution of the present program is terminated.

If an affirmative decision (YES) is obtained in any one of the above-described steps S41–S44, the control flow goes to step S45. That is, step S45 is implemented if any one of the following four conditions is satisfied: a condition that the rate of change of the thermal expansion which includes each robot 22, 24 is higher than the predetermined upper limit; a condition that there is any one component-mounting robots 22 not used for the component mounting operation on the present substrate 26; a condition that the stopping time of each component-mounting robot 22 is longer than the predetermined upper limit; and a condition that the number of the substrates 26 which have been transferred to the component-mounting position has increased to the predetermined value.

Step S45 is provided to generate a start command for initiating the robot-position thermal-expansion detecting program of FIG. 16 and the substrate-position thermal-expansion detecting program of FIG. 17. One cycle of execution of the thermal-expansion detecting timing control program of FIG. 18 is terminated after implementation of step S45.

Figure 19:
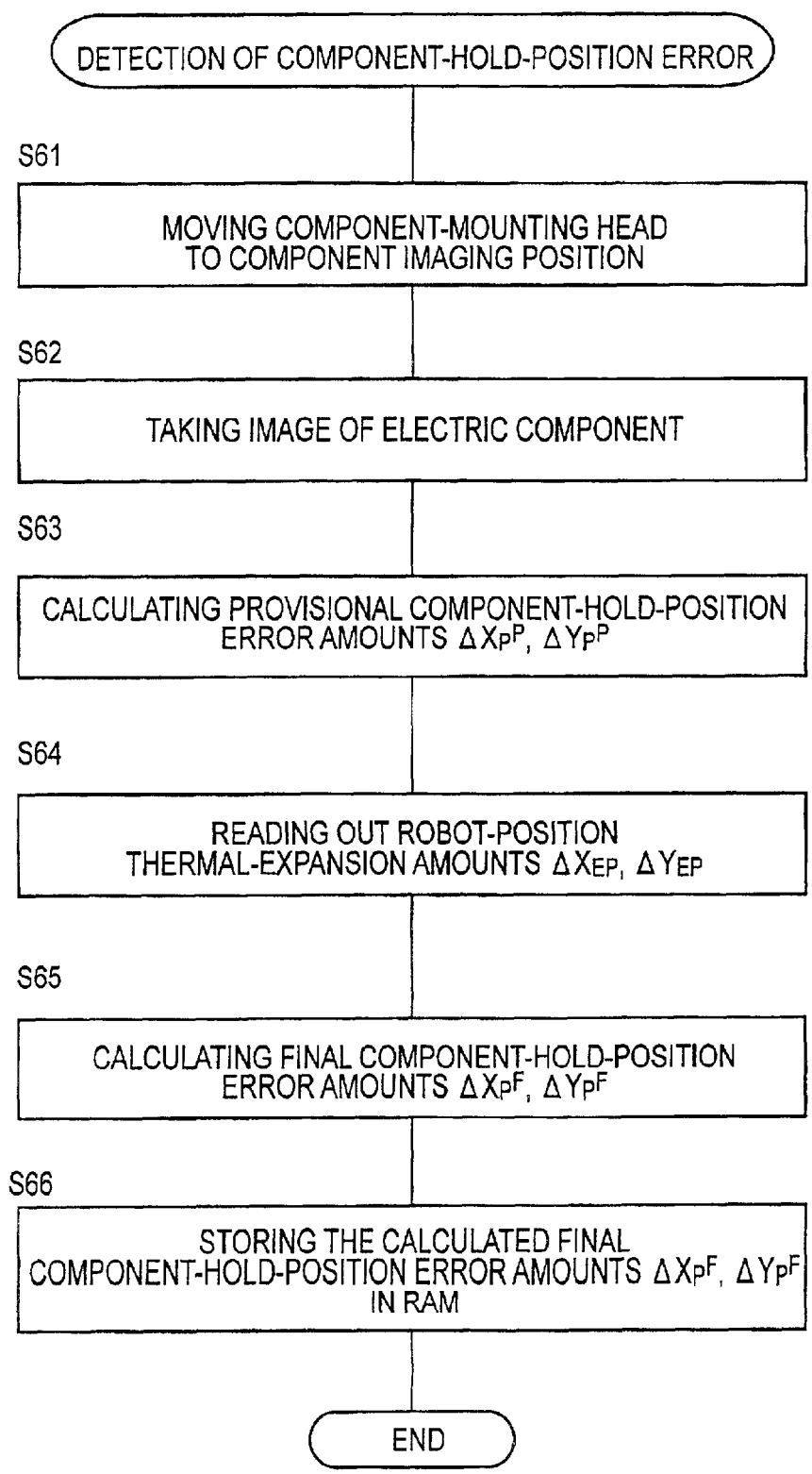
FIG. 19 is a flow chart schematically illustrating a component-hold-position error detecting program of FIG. 12.

The component-hold-position error detecting program is schematically illustrated in the flow chart of FIG. 19. This program is executed for each component-mounting robot 22, when each component 30 is mounted on the substrate 26.

The program of FIG. 19 is initiated with step S61 in which predetermined drive signals are applied to the X-axis and Y-axis servomotors 46, 48 to move the component-mounting head 32 together with the electronic component 30, to the component imaging position at which the electronic component 30 is substantially aligned with the first image-taking device 52 in the XY plane. These drive signals are determined such that the electronic component 30 is exactly located at the center of the imaging area or field of vision of the first image-taking device 52 when the amount of thermal expansion of the electronic-component mounting system 10 is aero and when the electronic component 30 is held at the nominal position on the component holder 50.

Then, step S62 is implemented to operate the first image-taking device 52 to take an image of the electronic component 30 as held by the component holder 50. Step S62 is followed by step S63 to calculate distances of deviation of the position of the image of the electronic component 30 with respect to the nominal position in the X-axis and Y-axis directions, as provisional component-hold-position error amounts $\Delta X_P^P$ and $\Delta Y_P^P$.

Then, step S64 is implemented to read out the robot-position thermal-expansion amounts $\Delta X_{EP}$ and $\Delta Y_{EP}$ from the RAM 106.

The control flow then goes to step S65 to calculate a final component-hold-position error amount $\Delta X_P^F$ by compensating the provisional component-hold-position error amount $\Delta X_P^P$ for the robot-position thermal-expansion amount $\Delta X_{EP}$.

In step S65, a final component-hold-position error amount $\Delta Y_P^F$ is calculated by compensating the provisional component-hold-position error amount $\Delta Y_P^P$ for a thermal-expansion amount $\Delta Y_{EPM}$ at the component imaging position. This thermal-expansion amount $\Delta Y_{EPM}$ is estimated on the above-described two assumptions that the amount of thermal expansion at the proximal end of the Y-axis ballscrew 40 is zero and that the thermal expansion of the Y-axis ballscrew 40 at a given axial position thereof is proportionally increased with a distance of that axial position from the proximal end of the ballscrew 40. Described more specifically, thermal-expansion amount $\Delta Y_{EPM}$ is estimated on the above-described two assumptions, and on the basis of (a) the robot-position thermal expansion amount $\Delta Y_{EP}$ read out from the RAM 106, (b) a distance of the actual thermal-expansion-detecting-mark imaging position (which may be replaced by the nominal thermal-expansion-detecting-mark imaging position) from the proximal end of the Y-axis ballscrew 40, and (c) a distance of the actual component imaging position (which may be replaced by the nominal component imaging position) from the proximal end of the Y-axis ballscrew 40. The thermal-expansion amount $\Delta Y_{EPM}$ at the component imaging position is estimated by first-order interpolation between the proximal end of the Y-axis ballscrew 40 and the thermal-expansion-detecting-mark imaging position.

Then, the control flow goes to step S66 to store the calculated final component-hold-position error amounts $\Delta X_P^F$ and $\Delta Y_P^F$ in the RAM 106. Thus, one cycle of execution of the program of FIG. 19 is terminated.

Figure 20:
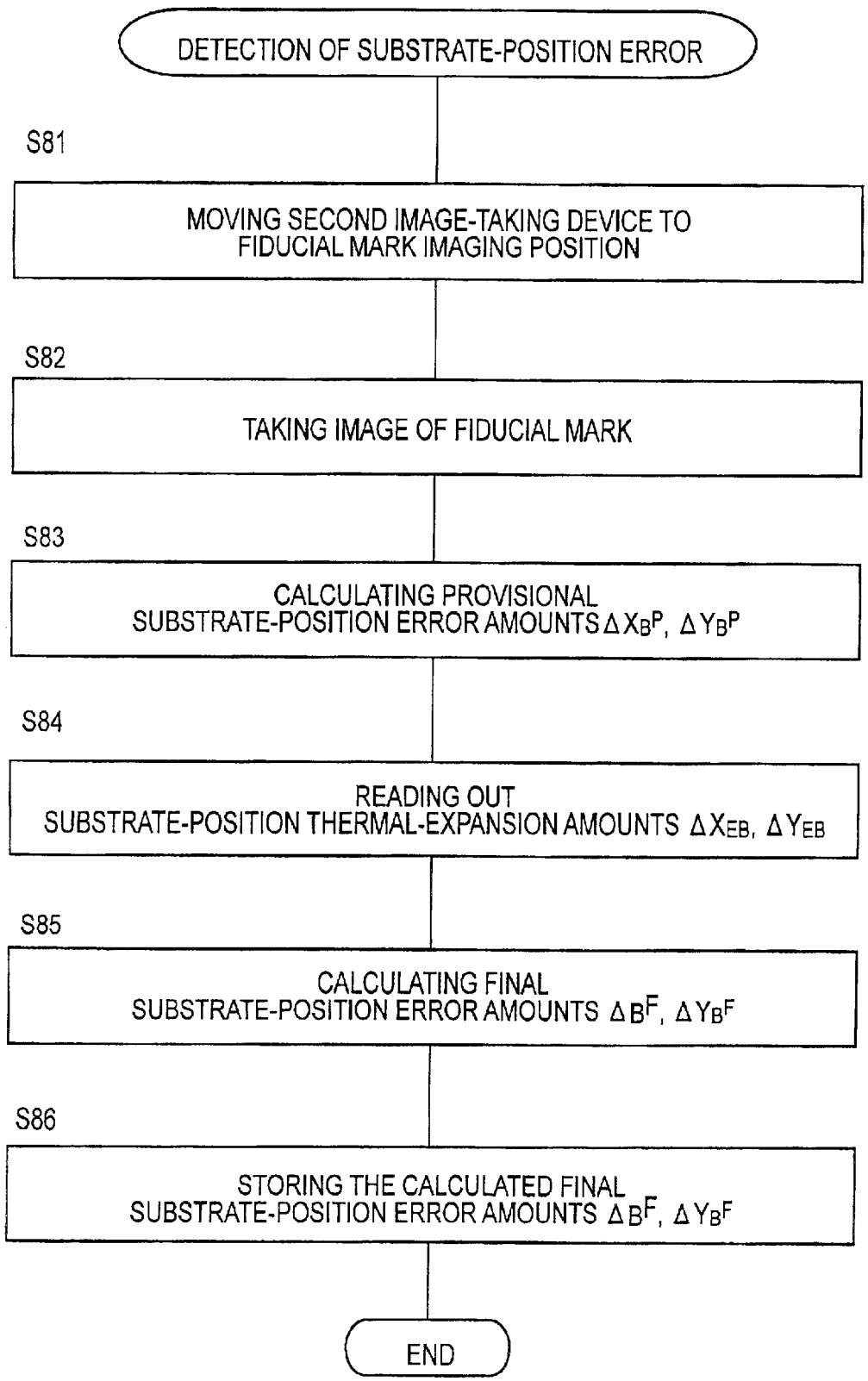
FIG. 20 is a flow chart schematically illustrating a substrate-position error detecting program of FIG. 12.

The substrate-position error detecting program is schematically illustrated in the flow chart of FIG. 20. This program is initiated before initiation of the component mounting operation on each substrate 26.

The substrate-position error detecting program of FIG. 20 is initiated with step S81 in which predetermined drive signals are applied to the X-axis and Y-axis drive signals to move the movable member 72 together with the second image-taking device 64 to the fiducial-mark imaging position at which the second image-taking device 74 is substantially aligned with the fiducial mark 76 in the XY plane. These drive signals are determined such that the center of the fiducial mark 76 is located at the center of the imaging area or field of vision of the second image-taking device 74 when the amount of thermal expansion of the system 10 is zero and when the substrate 26 is located by the conveyor 28 at the nominal position.

Then, the control flow goes to step S82 to operate the second image-taking device 74 to take an image of the fiducial mark 76. Step S83 is then implemented to calculate distances of deviation of the position of the image of the fiducial mark 76 with respect to the nominal position in the X-axis and Y-axis directions, as provisional substrate-position error amounts $\Delta X_B^P$ and $\Delta Y_{BP}$.

Step S84 is then implemented to read out to read out the substrate-position thermal-expansion amounts $\Delta X_{EB}$ and $\Delta Y_{EB}$ from the RAM 106.

The control flow then goes to step S85 to calculate a final component-hold-position error amount $\Delta X_B^F$ by compensating the provisional substrate-position error amount $\Delta X_B^P$ for the substrate-position thermal-expansion amount $\Delta X_{EB}$.

In step S85, a final substrate-position error amount $\Delta Y_B^F$ is calculated by compensating the provisional substrate-position error amount $\Delta Y_B^P$ for a thermal-expansion amount $\Delta Y_{EBM}$ at the fiducial-mark imaging position. This thermal-expansion amount $\Delta Y_{EBM}$ is estimated on the above-described two assumptions that the amount of thermal expansion at the proximal end of the Y-axis ballscrew 80 is zero and that the thermal expansion of the Y-axis ballscrew 80 at a given axial position thereof is proportionally increased with a distance of that axial position from the proximal end of the ballscrew 80. Described more specifically, thermal-expansion amount $\Delta Y_{EBM}$ is estimated on the above-described two assumptions, and on the basis of (a) the substrate-position thermal expansion amount $\Delta Y_{EB}$ read out from the RAM 106, (b) a distance of the actual fiducial-mark imaging position (which may be replaced by the nominal fiducial imaging position) from the proximal end of the Y-axis ballscrew 80, and (c) a distance of the actual fiducial-mark imaging position (which may be replaced by the nominal fiducial-mark imaging position) from the proximal end of the Y-axis ballscrew 80. The thermal-expansion amount $\Delta Y_{EBM}$ at the fiducial-mark imaging position is estimated by first-order interpolation between the proximal end of the Y-axis ballscrew 80 and the thermal-expansion-detecting-mark imaging position.

Then, the control flow goes to step S86 to store the calculated final substrate-position error amounts $\Delta X_B^F$ and $\Delta Y_B{}^F$ in the RAM 106. Thus, one cycle of execution of the program of FIG. 20 is terminated.

Figure 21:
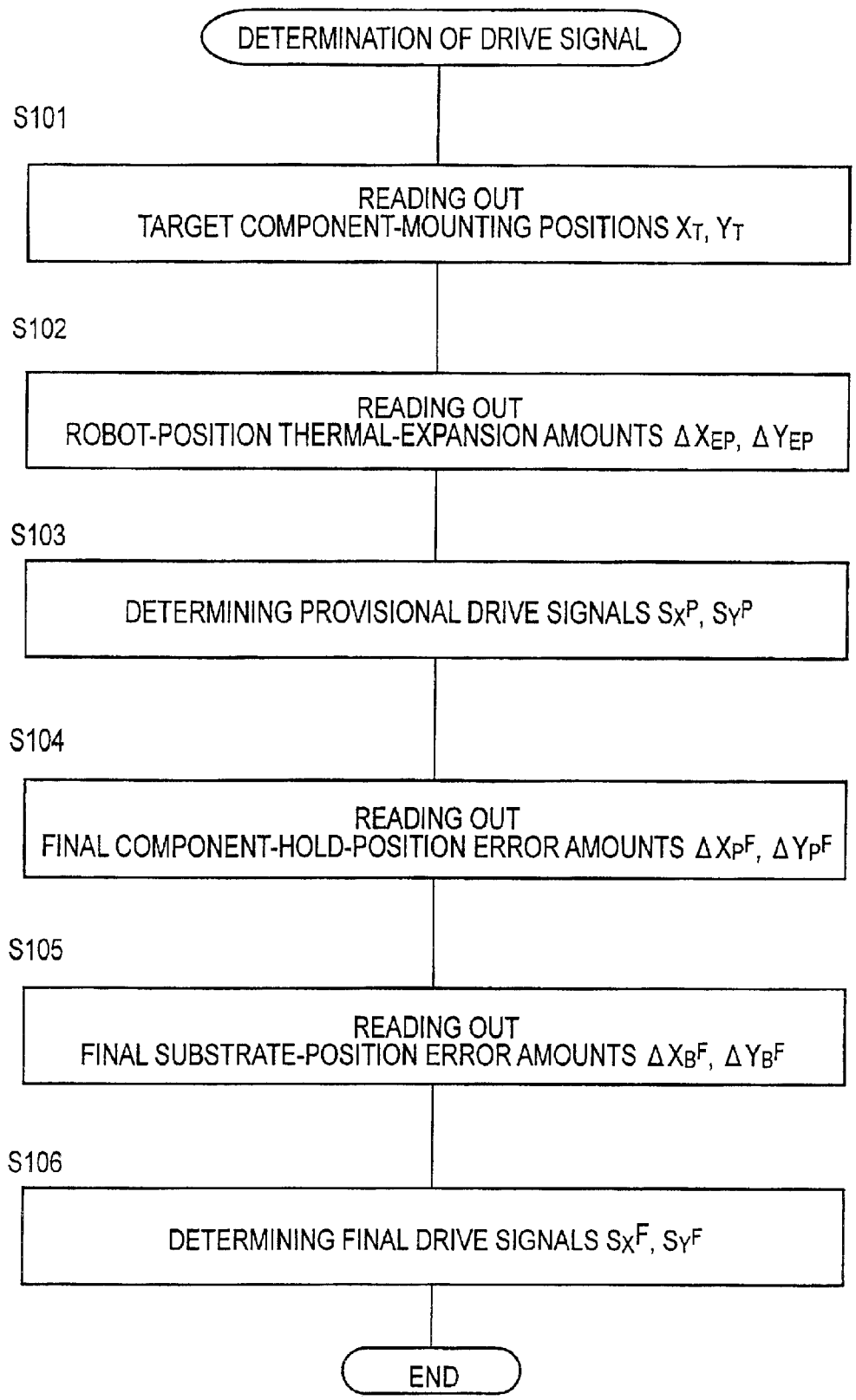
FIG. 21 is a flow chart schematically illustrating a drive signal determining program of FIG. 12.

The drive-signal determining program is schematically illustrated in the flow chart of FIG. 21. This program is executed for each component-mounting robot 22, when each component 30 is mounted on the substrate 26.

This program is initiated with step S101 to read out from the RAM 106 target component-mounting positions $X_T$, $Y_T$ at which the electronic components 30 are to be mounted on the present substrate 26. For instance, data representative of these target component-mounting positions $X_T$, $Y_T$ are transferred from an external device to the RAM 106, before step S101 is implemented.

Then, the control flow goes to step S102 to read out from the RAM 106 the robot-position thermal-expansion amounts $\Delta X_{EP}$ and $\Delta Y_{EP}$. Step S103 is then implemented to determine provisional drive signals $S_X{}^P$ and $S_Y{}^P$ to be applied to the X-axis and Y-axis servomotors 46, 48.

In step S103, the provisional X-axis drive signal $S_X{}^P$ is determined on the basis of the target component-mounting position $X_T$ and the robot-position thermal-expansion amount $\Delta X_{EP}$, on an assumption that the thermal-expansion amount $\Delta X_{EP}$ is constant between the present position of the component-mounting head 32 and the target component-mounting position $X_T$, so that the actual component-mounting position of the electronic component 30 is not influenced by the robot-position thermal-expansion amount $\Delta X_{EP}$.

On the other hand, the provisional Y-axis drive signal $S_Y{}^P$ is determined on the basis of the target component-mounting position $Y_T$ and the robot-position thermal-expansion amount $\Delta Y_{EP}$, and according to the relationship indicated in FIG. 15, and on the above-indicated two assumptions that the amount of thermal expansion at the proximal end of the Y-axis ballscrew 40 is zero and that the thermal expansion of the Y-axis ballscrew 40 at a given axial position thereof is proportionally increased with a distance of that axial position from the proximal end of the ballscrew 40. Described in detail, the thermal-expansion amount at the target component-mounting position $Y_T$ is estimated by first-order interpolation between the proximal end of the Y-axis ballscrew 40 and the thermal-expansion-detecting-mark imaging position.

Step S104 is then implemented to read out from the RAM 106 the final component-hold-position error amounts $\Delta X_P{}^F$ and $\Delta Y_P{}^F$, and step S105 is implemented to read out from the RAM 106 the final substrate-position error amounts $\Delta X_B{}^F$ and $\Delta Y_B{}^F$.

Then, the control flow goes to step S106 to determine final drive signals $S_X{}^F$ and $S_Y{}^F$ to operate the respective X-axis and Y-axis servomotors 46, 48. The final drive signal $S_X{}^F$ is determined by compensating the provisional drive signal $S_X{}^P$ for the final component-hold-position position error amount $\Delta X_P{}^F$, and the final substrate-position error amount $\Delta X_B{}^F$. The final drive signal $S_Y{}^F$ is determined by compensating the provisional drive signal $S_Y{}^P$ for the final component-hold-position position error amount $\Delta Y_P{}^F$, and he final substrate-position error amount $\Delta Y_B{}^F$.

Thus, one cycle of execution of the drive-signal determining program of FIG. 21 is terminated.

The thus determined final drive signals $S_X{}^F$ and $S_Y{}^F$ are applied to the respective X-axis and Y-axis servomotors 46, 48 according to a control program (not shown) executed by the computer 108, so that the component-mounting head 32 of each component-mounting robot 22 is moved together with the electronic component 30 in the X-axis and Y-axis direction to the target component-mounting position XT, YT on the substrate 26.

It will be understood from the foregoing description of the present embodiment that the substrate 26 is an example of a substrate on which the electronic components 30 are to be mounted, while the frame 12 is an example of a main body structure of the electronic-component mounting system 10, and that the X-axis servomotors 46, 82 and the Y-axis servomotors 48, 84 are examples of a drive device. It will also be understood that the X-axis ballscrew 38 and the Y-axis ballscrew 40 of each component-mounting robot 22 cooperate to constitute an example of a motion-transmitting member and that the X-axis ballscrew 38 is an example of a second motion-transmitting member while the Y-axis ballscrew 40 is an example of a first motion-transmitting member. It will further be understood that the component-mounting head 32 cooperates with the X-axis guide rail 49 to constitute an example of a movable portion, and that the component-mounting head 32 is an example of a second movable portion (X-axis movable portion), while the X-axis guide rail 49 is an example of a first movable portion (Y-axis movable portion). It will also be understood that the component holder 50 is an example of a component holder for holding an electric component while the X-axis ballscrew 78 and the Y-axis ballscrew 80 of the image-taking robot 24 cooperate to constitute an example of a motion-transmitting member, and that the movable member 72 and the X-axis guide rail 81 cooperate to constitute an example of a movable portion, while the movable member 72 is an example of a movable member.

It will further be understood that the thermal-expansion detecting mark 54, main body 56, projecting member 58 and surface-light-emitting sheet 60 cooperate to constitute an example of an object to be imaged by the first image-taking device 52, while the thermal-expansion detecting mark 92, main body 94, projecting member 96 and surface-light-emitting sheet 98 cooperate to constitute an example of an object to be imaged by the second image-taking device 74. It will also be understood that each of the thermal-expansion detecting marks 54, 92 is an example of a central portion of the object to be imaged, while each of the surface-light-emitting sheets 60, 98 is an example of a peripheral portion of the object to be imaged, and an example of a planar element or adhesive seal attached or bonded to the main body 56 or 94. It will further be understood that each of the main bodies 56, 94 is an example of a main body of the object to be imaged, while each of the projecting members 58, 96 is an example of a projecting portion of the object. It will further be understood that each of the first image-taking devices 52 for the component-mounting robots 22 and the second image-taking device for the image-taking robot 24 is an example of a image-taking device 74.

It will also be understood that the position on the frame 12 at which the first image-taking device 52 is fixedly disposed is an example of a position at which the first image-taking device 52 is not substantially influenced by thermal expansion of the electronic-component mounting system 10 and other factors of the system 10, and that the position on the component-mounting head 32 at which the thermal-expansion detecting mark 54 is fixedly provided is an example of a position at which the detecting mark 54 is not substantially influenced by thermal expansion of the electronic-component mounting system 10 and other factors of the system 10. It will further be understood that the position on the frame 12 at which the thermal-expansion detecting mark 92 is fixedly provided in an example of a position at which the detecting mark 92 is not substantially influenced by thermal expansion of the electronic-component mounting system 10 and other factors of the system 10, while the position on the movable member 72 at which the second image-taking device 74 is fixedly disposed is an example of a position at which the second image-taking device 74 is influenced by thermal expansion of the electronic-component mounting system 10 but is not substantially influenced by other factors of the system 10.

It will further be understood that the controller 100 is an example of a controller, while a portion of the controller 100 assigned to implement step S65 of FIG. 19, step S85 of FIG. 20 and steps S103 and S106 of FIG. 21 constitutes an example of proportional-type drive-signal determining means. Described more specifically, this proportional-type drive-signal determining means is arranged to estimate the Y-axis thermal-expansion amount $\Delta Y_{EPM}$ at the component imaging position and the Y-axis final component-hold-position error amount $\Delta Y_P^F$ in step S65, calculate the Y-axis thermal-expansion amount $\Delta Y_{EBM}$ at the fiducial-mark imaging position and the Y-axis final substrate-position error amount $\Delta Y_B^F$ in step S85, and calculate the provisional and final Y-axis drive signals $S_Y^P$, $S_Y^F$ in step S103 and S106. It will also be understood that a portion of the controller 100 assigned to implement step S41 constitutes an example of imaging-frequency control means for operating the image-taking device 54 to take the image of the detecting mark 54 more frequency when the rate of change of the thermal-expansion positioning error is relatively high than when the rate of change is relatively low. It will further be understood that the proximal end of each Y-axis ballscrew 40, 80 is an example of a reference point on the motion-transmitting member.

There will next be described an electronic-component mounting system 150 constructed according to a second embodiment of the present invention. The same reference signs as used in the first embodiment will be used in the second embodiment, to identify the corresponding elements, which will not be described. Only the elements of the second embodiment which are not present in the first embodiment or which are different from those in the first embodiment will be described in detail.

In the first embodiment, each of the X-axis movable portions in the form of the component-mounting heads 32 carries the component holder 50 and the thermal-expansion detecting mark 54, so that the component holder 50 and the thermal-expansion detecting mark 54 are always moved together in the X-axis direction parallel to the X-axis ballscrew 38 and in the Y-axis direction parallel to the Y-axis ballscrew 40.

Figure 22:
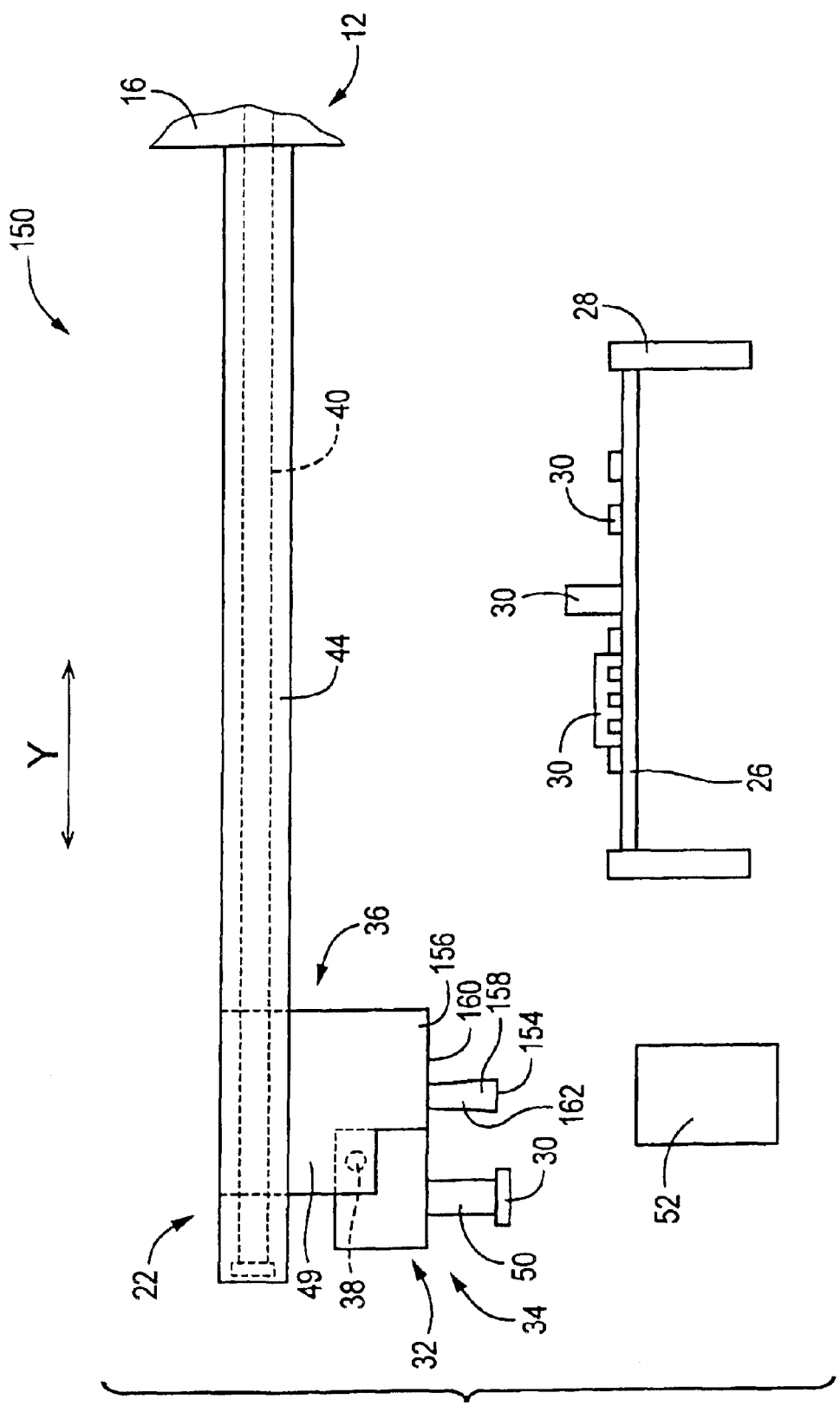
FIG. 22 is a side elevational view showing the Y-axis positioning device 36 located at the imaging position of the thermal-expansion detecting mark, in the component-mounting robot 22, together with the first image-taking device 52, in an electric-component mounting system 150 according to a second embodiment of this invention.

In the electronic-component mounting system 150 of the present second embodiment shown in FIG. 22, the component holder 50 is disposed on each component-mounting head 32, but a thermal-expansion detecting mark 154 corresponding to the detecting mark 54 in the first embodiment is provided on the Y-axis movable portion in the form of the X-axis guide rail 49. In this second embodiment, the component holder 50 is movable in both of the X-axis and Y-axis directions, but the thermal-expansion detecting mark 154 is movable in only the Y-axis direction.

As shown in FIG. 22, the thermal-expansion detecting mark 154 is provided on the end face of a projecting member 158 which extends downwards from a horizontal lower surface of a main body 156 of the X-axis guide rail 49. While the thermal-expansion detecting mark 154 in the second embodiment is different from the thermal-expansion detecting mark 54 in the first embodiment in that the detecting mark 154 is provided on the X-axis guide rail 49, the second embodiment is similar to the first embodiment in the other aspects. Namely, the projecting member 158 is tapered, and the lower surface of the main body 156 is covered by a planar element in the form of a surface-light-emitting sheet 160. The sheet 160 may be replaced by an adhesive-backed layer bonded on the lower surface of the main body 156. The projecting member 158 has a projecting part 162, and a proximal end part which has a smaller diameter than the projecting part 162 and which is similar to the proximal end part 63 of the sheet 60. The surface-light-emitting sheet 160 has a through-hole similar to the through-hole 66, in which is fitted the proximal end portion of the projecting member 158. The projecting member 158 is attached to the main body 156 such that a shoulder surface which is similar to the shoulder surface 67 and which is formed between the projecting part 162 and the proximal end part is held in abutting contact with a portion of the sheet 160 in which is formed the through-hole.

In the present embodiment, an image of the thermal-expansion detecting mark 154 is taken by the first image-taking device 52 when the detecting mark 154 is located at a thermal-expansion-detecting-mark imaging position of FIG. 22 at which the detecting mark 154 is aligned with the first image-taking device 52 in the XY plane.

In the first embodiment, the overall amount of thermal expansion at each component-mounting robot 22 in the X-axis is detected by using the thermal-expansion detecting mark 54 provided on each component-mounting head 32. In the present second embodiment, on the other hand, the overall amount of thermal expansion at each component-mounting robot 22 in the X-axis direction is detected by using the thermal-expansion detecting mark 154 provided on the X-axis guide rail 49.

The amount of thermal expansion at each component-mounting robot 22 in the Y-axis direction is detected in the same manner as in the first embodiment. That is, the amount of thermal expansion of the Y-axis ballscrew 40 at a given axial position of the ballscrew 40 is detected on the basis of the image of the thermal-expansion detecting mark 154, on the same two assumptions as used in the first embodiment.

As described above, the thermal-expansion detecting mark 154 used in the present second embodiment is provided on the X-axis guide rail 49 which is not moved in the X-axis direction. In the first embodiment, the thermal expansion of the X-axis ballscrew 38 is ignored in detecting the overall amount of thermal expansion in the X-axis direction which influences the component-holding head 32. In this respect, the thermal-expansion detecting mark 154 provided on the X-axis rail 49 provides substantially the same effect as in the first embodiment, regarding the detection of the thermal expansion in the X-axis direction.

In the first embodiment in which the thermal-expansion detecting mark 54 is provided on the component-mounting head 32, the weight of the component-mounting head 32 is increased, so that the component-mounting head 32 (component holder 50) tends to have a lower response to drive signals for its movements in the X-axis and Y-axis directions, than the head 32 in the second embodiment.

In the present second embodiment in which the thermal-expansion detecting mark 154 is provided on the X-axis guide rail 49 not movable in the X-axis direction, the weight of the projecting member 158 carrying the thermal-expansion detecting mark 154 is not added to an inertial weight of the component-mounting head 32, so that the response of the head 32 to the drive signals is not significantly lowered.

In the present embodiment, the electronic-component mounting system 150 is operated under the control of the computer 108 according to six control programs which are basically the same as the programs illustrated in the flow charts of FIGS. 16–21.

It will be understood from the foregoing description of the second embodiment that the frame 12 is an example of a main body structure of the mounting system 150 and that the X-axis ballscrew 38 and Y-axis ballscrew 40 cooperate to constitute an example of a motion-transmitting member. It will also be understood that the X-axis ballscrew 38 is an example of a second motion-transmitting member while the Y-axis ballscrew 40 is an example of a fist motion-transmitting member, and that the component-mounting head 32 and the X-axis guide rail 49 cooperate to constitute an example of a movable portion. It will further be understood that the component-mounting head 32 is an example of a second movable portion while the X-axis guide rail 49 is an example of a first movable portion, and that the component holder 50 is an example of a component holder for holding the electric component.

It will also be understood that the thermal-expansion detecting mark 154, main body 156, projecting member 158 and surface-light-emitting sheet 160 cooperate to constitute an example of an object to be imaged by the first image-taking device 52, and that the thermal-expansion detecting mark 154 is an example of a central portion of the object to be imaged, while the surface-light-emitting sheet 160 is an example of a peripheral portion of the object to be imaged, and an example of a planar element or adhesive-backed layer attached or bonded to the main body 156. It will also be understood that the main body 156 is an example of a main body of the object to be imaged, while the projecting member 158 is an example of a projecting portion of the object.

It will further be understood that the position on the X-axis guide rail 49 at which the thermal-expansion detecting mark 154 is fixedly disposed is an example of a position at which the detecting mark 154 is influenced by thermal expansion of the electronic-component mounting system 150 but is not substantially influenced by other factors of the system 150.

Figure 23:
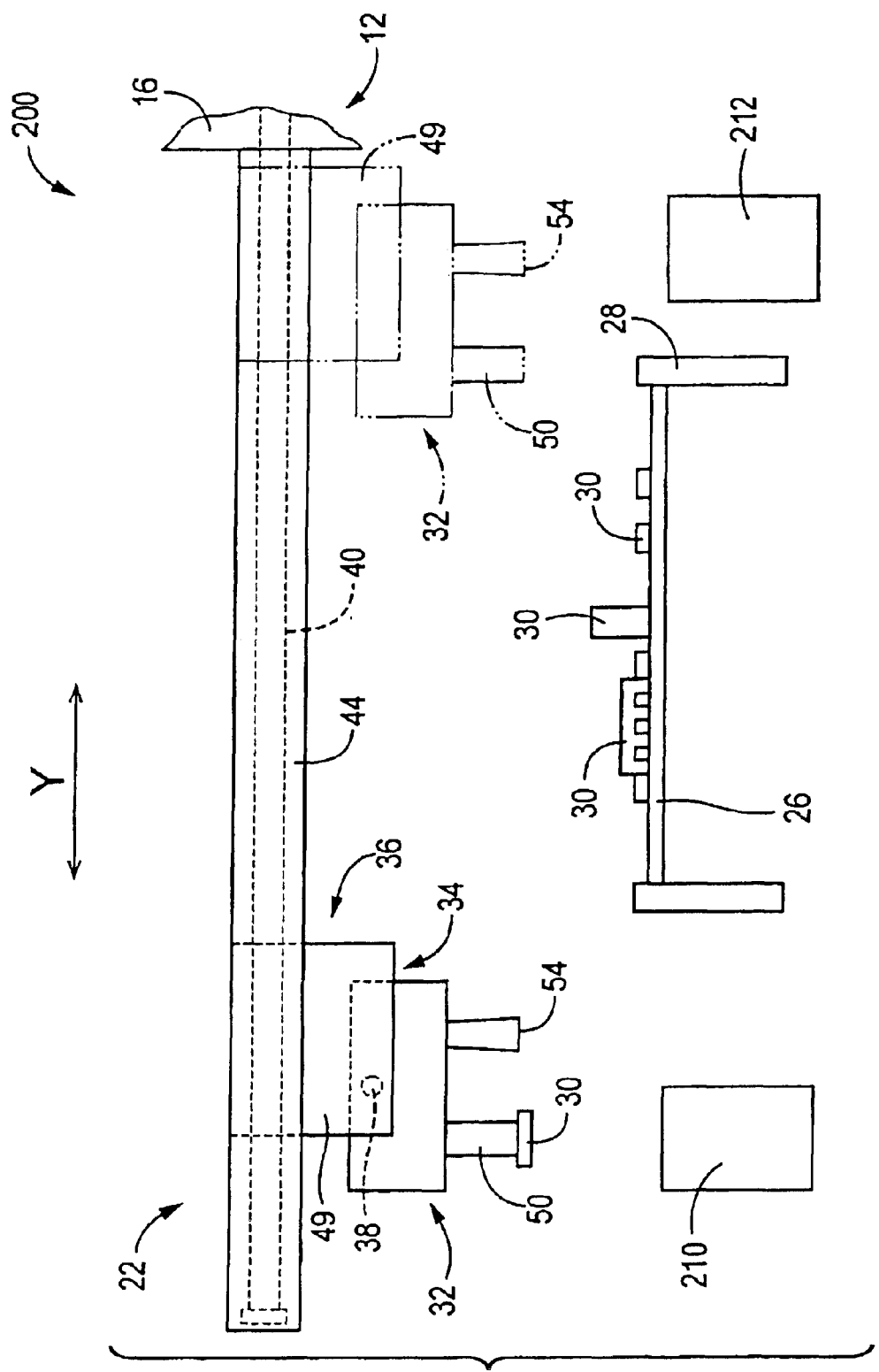
FIG. 23 is a side elevational view showing the Y-axis positioning device 36 of the component-mounting robot 22, together with two first image-taking devices 210, 212, in an electric-component mounting system 200 according to a third embodiment of this invention.

Referring next to FIG. 23, there will be described an electronic-component mounting system 200 constructed according to a third embodiment of this invention. The same reference signs as used in the first embodiment will be used in the third embodiment, to identify the corresponding elements, which will not be described. Only the elements of the third embodiment which are not present in the first embodiment or which are different from those in the first embodiment will be described in detail.

In the first embodiment, one first image-taking device 52 is fixedly disposed on the frame 12, for each of the component-mounting robots 22, while one thermal-expansion detecting mark 92 is fixedly disposed on the frame 12, for the image-taking robot 24. In the first embodiment, one thermal-expansion-detecting-mark imaging position is provided for each of the robots 22, 24, and the problem of the thermal expansion in the Y-axis direction is solved by detection of the amount of thermal expansion at a given axial position of the Y-axis ballscrews 40, 80, and the above-indicated two assumptions, namely, the first assumption that the amount of thermal expansion at the proximal end of the Y-axis ballscrew 40, 80 is zero, and the second assumption that the amount of thermal expansion of the Y-axis ballscrew 40, 80 at a given axial position thereof is proportionally increased with a distance of that axial position from the proximal end of the ballscrew 40, 80.

In the present embodiment shown in FIG. 23, there are provided two first image-taking devices 210, 212 for each of the component-mounting robots 22. These two first image-taking devices 210, 212 are similar in construction to the first image-taking device 52 provided in the first embodiment. The first image-taking devices 210, 212 are fixedly disposed at respective portions of the frame 12 at which the amounts of thermal expansion due to a temperature rise are relatively small. The first image-taking device 210 is located at the same position as the first image-taking device 52 in the first embodiment, while the first image-taking device 212 is located at a position spaced from the position of the device 210 in the Y-axis direction, more specifically, at a position between the proximal end of the Y-axis ballscrew 40 and the conveyor 28. The position at which the first image-taking device 210 takes an image of the thermal-expansion detecting mark 54 is referred to as a first thermal-expansion-detecting-mark imaging position, and the position at which the second image-taking device 212 takes the image of the detecting mark 54 is referred to as a second thermal-expansion-detecting-mark imaging position.

Figure 24:
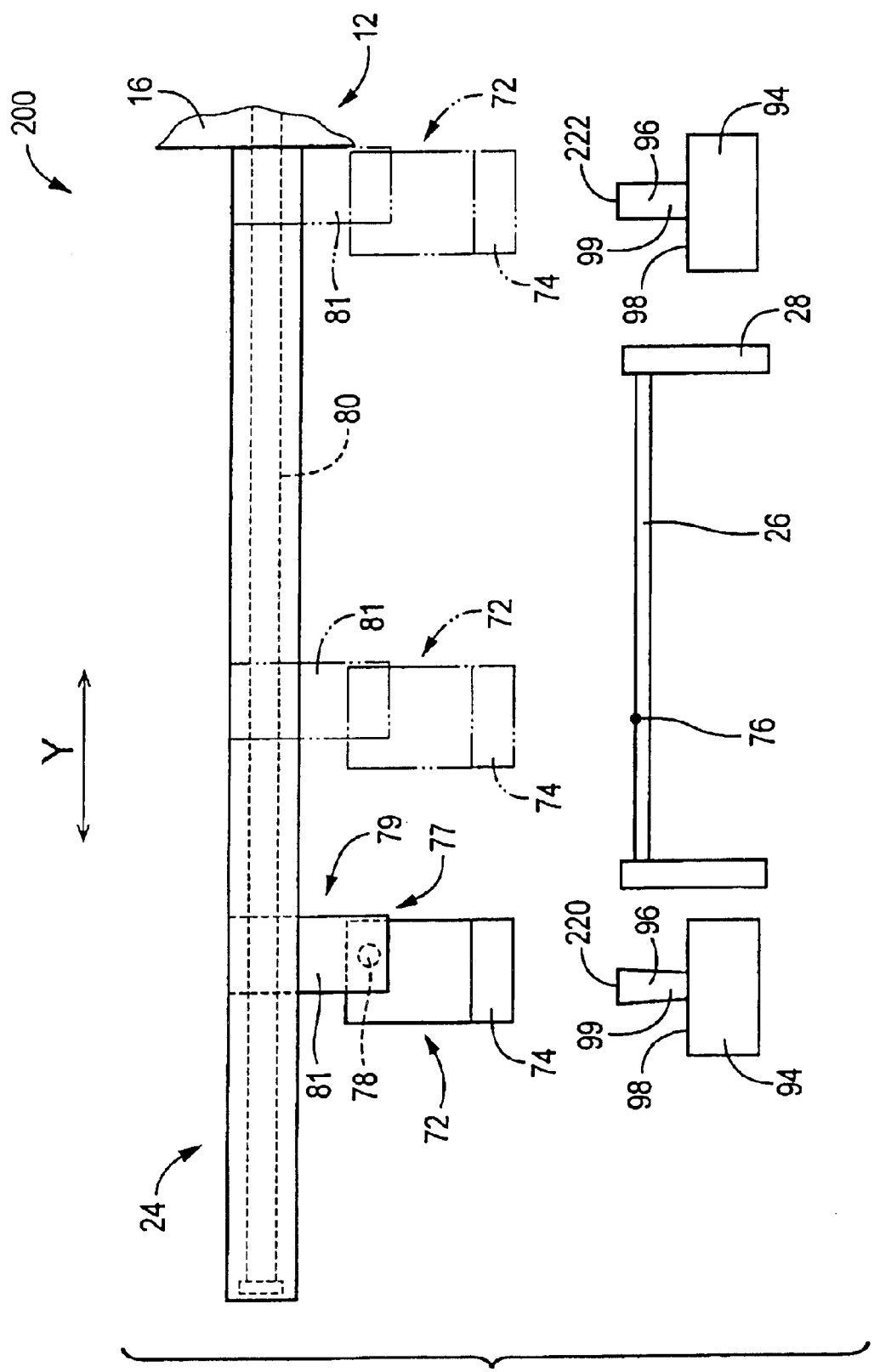
FIG. 24 is a side elevational view showing a Y-axis positioning device 79 of the component-mounting robot 22, together with two thermal-expansion detecting marks 220, 222, in the electric-component mounting system 200.

As shown in FIG. 24, the present embodiment is further provided with two thermal-expansion detecting marks 220, 222 for the image-taking robot 24. These two thermal-expansion detecting marks 220, 222 are similar to the thermal-expansion detecting mark 92 provided in the first embodiment. The two detecting marks 220, 222 are fixedly provided at respective portions of the frame 12 at which the amounts of thermal expansion due to a temperature rise are relatively small. The thermal-expansion detecting mark 220 is located at the same position as the detecting mark 92 in the first embodiment, while the detecting mark 222 is located at a position spaced from the position of the detecting mark 220 in the Y-axis direction, more specifically, at a position between the proximal end of the Y-axis ballscrew 80 and the fiducial-mark imaging position, that is, at a position considerably near the proximal end of the ballscrew 80. The position at which the second image-taking device 74 takes an image of the detecting mark 220 is referred to as a first thermal-expansion-detecting-mark imaging position, and the position at which the second image-taking device 74 takes the image of the detecting mark 222 is referred to as a second thermal-expansion-detecting-mark imaging position.

In the present embodiment, the problem of the thermal expansion in the X-axis direction is solved in the same manner as in the first embodiment, but the problem of the thermal expansion in the Y-axis direction is solved in a different manner. In the first embodiment, it is assumed that the amount of thermal expansion at the proximal end of the Y-axis ballscrew 40, 80 is zero. In the present third embodiment, however, the amount of thermal expansion is detected at the second thermal-expansion-detecting-mark imaging position as well as the first thermal-expansion-detecting-mark imaging position.

Figure 25:
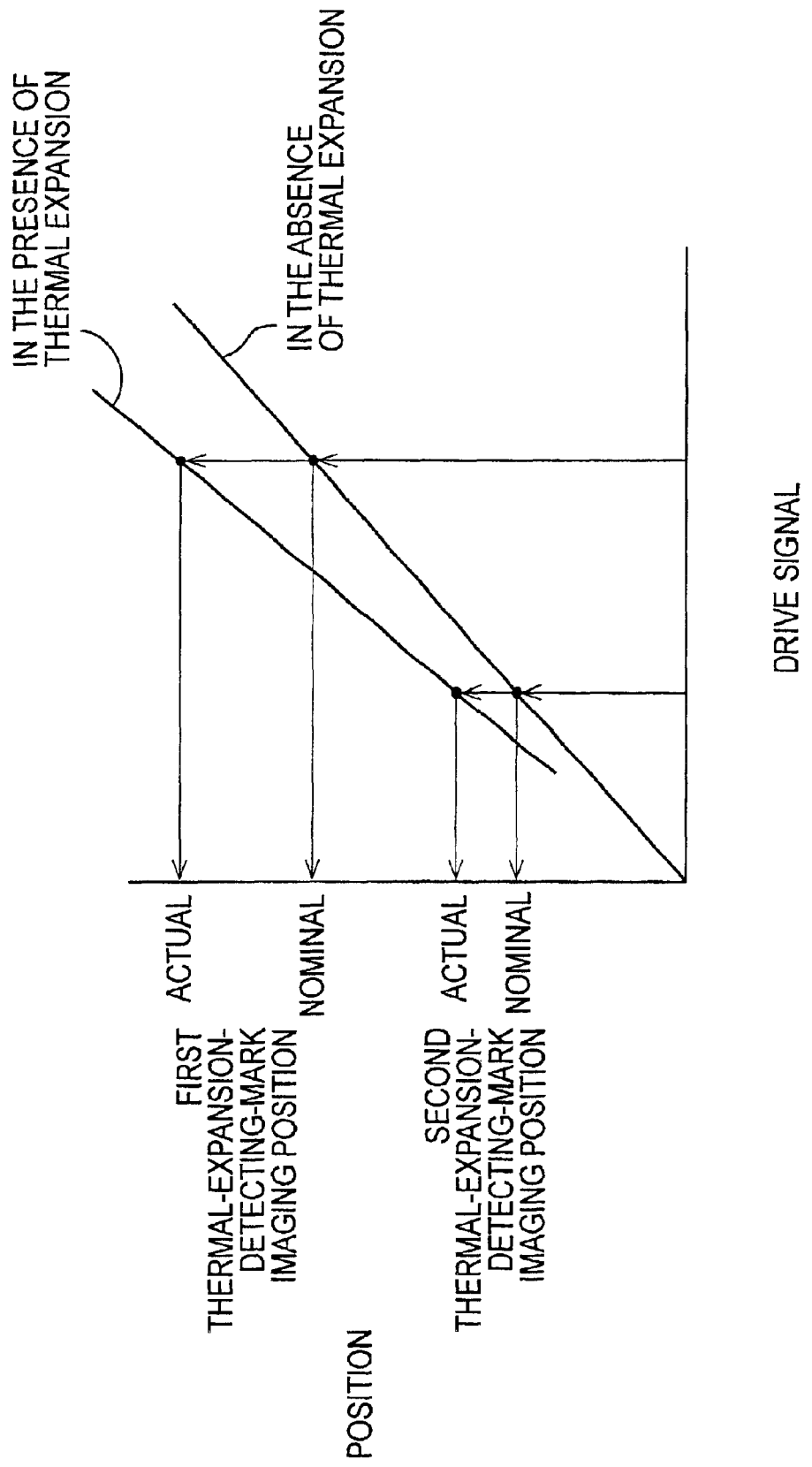
FIG. 25 is a graph for explaining a principle of solving a problem of thermal expansion in the electric-component mounting system 200.

As shown in FIG. 25, a relationship between the drive signal to operate the servomotors 48, 84 and the position of the X-axis movable portion (component-mounting head 32 or movable member 72) can be obtained on the basis of the amounts of thermal expansion detected at the first and second thermal-expansion-detecting-mark imaging positions, and on the assumption that the amount of thermal expansion of the Y-axis ballscrew 40, 80 at a given axial position thereof between the first and second thermal-expansion-detecting-mark imaging positions is proportionally increased with a distance of that axial position from the first or second thermal-expansion-detecting-mark imaging position. This relationship is represented by an upper on of two straight lines indicated in the graph of FIG. 25.

In the present embodiment, the problem of thermal expansion in the Y-axis direction is solved on the basis of the two amounts of thermal expansion detected at the respective two thermal-expansion-detecting-mark imaging positions, and according to the predetermined relationship obtained as described above.

In the present embodiment, the electronic-component mounting system 200 is operated under the control of the computer 108 according to six control programs which are basically the same as the programs illustrated in the flow charts of FIGS. 16–21.

In the present third embodiment, however, the robot-position thermal-expansion detecting program used in the first embodiment is modified to calculate first robot-position thermal expansion amounts $\Delta X_{EP1}$ and $\Delta Y_{EP1}$ on the basis of the image of the detecting mark 54 taken at the first thermal-expansion-detecting-mark imaging position, and calculate second robot-position thermal expansion amounts $\Delta X_{EP2}$ and $\Delta Y_{EP2}$ on the basis of the image of the detecting mark 54 taken at the second thermal-expansion-detecting-mark imaging position.

Further, the substrate-position thermal-expansion detecting program used in the first embodiment is modified to calculate first substrate-position thermal expansion amounts $\Delta X_{EB1}$ and $\Delta Y_{EPB}$ on the basis of the image of the detecting mark 220 taken at the first thermal-expansion-detecting-mark imaging position, and calculate second robot-position thermal expansion amounts $\Delta X_{EB2}$ and $\Delta Y_{EB2}$ on the basis of the image of the detecting mark 222 taken at the second thermal-expansion-detecting-mark imaging position.

Further, the step S65 of the component-hold-position error detecting program used in the first embodiment is modified as described below in the present embodiment.

That is, the final component-hold-position error amount $\Delta X_P^F$ is calculated by compensating the provisional component-hold-position error amount $\Delta X_P^P$ for the first robot-position thermal-expansion amount $\Delta X_{EP1}$.

Further, the final component-hold-position error amount $\Delta Y_P^F$ is calculated by compensating the provisional component-hold-position error amount $\Delta Y_P^P$ for a thermal-expansion amount $\Delta Y_{EPM}$ at the component imaging position. This thermal-expansion amount $\Delta Y_{EPM}$ is estimated on an assumption that the thermal expansion of the Y-axis ballscrew 40 at a given axial position thereof is proportionally increased with a distance of that axial position from a predetermined reference point on the Y-axis ballscrew 40 (one of the first and second thermal-expansion-detecting-mark imaging positions). Described more specifically, thermal-expansion amount $\Delta Y_{EPM}$ is estimated on the above-described assumption, and on the basis of (a) the first and robot-position thermal expansion amounts $\Delta Y_{EP1}$ and $\Delta Y_{EP2}$ read out from the RAM 106, (b) a distance between the actual first and second thermal-expansion-detecting-mark imaging position (which may be replaced by the nominal first and second thermal-expansion-detecting-mark imaging positions), and (c) a distance of the actual component imaging position (which may be replaced by the nominal component imaging position) from the reference point on the Y-axis ballscrew 40, that is, from one of the first and second thermal-expansion-detecting-mark imaging positions. The thermal-expansion amount $\Delta Y_{EPM}$ at the component imaging position is estimated by first-order interpolation between the first and second thermal-expansion-detecting-mark imaging positions.

Further, the step S85 of the substrate-position error detecting program used in the first embodiment is modified as described below in the present embodiment.

That is, the final component-hold-position error amount $\Delta X_B^F$ is calculated by compensating the calculated provisional substrate-position error amount $\Delta X_B^P$ for the first substrate-position thermal-expansion amount $\Delta X_{EB1}$ read out from the RAM 106

Further, the final substrate-position error amount $\Delta Y_B^F$ is calculated by compensating the provisional substrate-position error amount $\Delta Y_B^P$ for a thermal-expansion amount $\Delta Y_{EBM}$ at the fiducial-mark imaging position. This thermal-expansion amount $\Delta Y_{EBM}$ is estimated on the assumption that the amount of thermal expansion at a given axial position of the Y-axis ballscrew 80 is proportionally increased with a distance of that axial position from the reference point on the ballscrew 80. Described more specifically, thermal-expansion amount $\Delta Y_{EBM}$ is estimated on the above-described assumption, and on the basis of (a) the first and second substrate-position thermal expansion amounts $\Delta Y_{EB1}$ and $\Delta Y_{EB2}$ read out from the RAM 106, (b) a distance between the actual first and second thermal-expansion-detecting-mark imaging positions (which may be replaced by the nominal first and second thermal-expansion-detecting-mark imaging positions), and (c) a distance of the actual fiducial-mark imaging position (which may be replaced by the nominal fiducial-mark imaging position) from the reference point on the Y-axis ballscrew 80, that is, from one of the first and second thermal-expansion-detecting-mark imaging positions. The thermal-expansion amount $\Delta Y_{EBM}$ at the fiducial-mark imaging position is estimated by first-order interpolation between the first and second thermal-expansion-detecting-mark imaging positions.

In addition, the step S103 of the drive-signal determining program used in the first embodiment is modified as described below in the present embodiment.

That is, the provisional X-axis drive signal $S_X^P$ is determined on the basis of the target component-mounting position $H_T$, on an assumption that the first thermal-expansion amount $\Delta X_{EP1}$ is constant between the present position of the component-mounting head 32 and the target component-mounting position $H_T$, so that the actual component-mounting position of the electronic component 30 is not influenced by the first robot-position thermal-expansion amount $\Delta X_{EP1}$.

On the other hand, the provisional Y-axis drive signal $S_Y^P$ is determined on the basis of the target component-mounting position $Y_T$, and the first and second robot-position thermal-expansion amounts $\Delta Y_{EP1}$ and $\Delta Y_{EP2}$, and according to the relationship indicated in FIG. 25, and on the assumption that the thermal expansion of the Y-axis ballscrew 40 at a given axial position thereof is proportionally increased with a distance of that axial position from the reference point on the ballscrew 40. Described in detail, the thermal-expansion amount at the target component-mounting position $Y_T$ is estimated by first-order interpolation between the first and second thermal-expansion-detecting-mark imaging positions, one of which is determined as the reference point on the Y-axis ballscrew 40.

It is noted that the problem of thermal expansion in the Y-axis direction is solved by the first-order interpolation between the two thermal-expansion-detecting-mark imaging positions, on the assumption that the amount of thermal expansion at a given axial position of each Y-axis ballscrew 40, 80 is proportionally increased with a distance of that axial position from the reference point on the ballscrew 40, 80. However, this way of solution of the problem of thermal expansion in the Y-axis direction is not essential to practice the present invention. For instance, the problem may be solved by a curvic interpolation such as a spline interpolation between the proximal end of each Y-axis ballscrew 40, 80 (at which the ballscrew 40, 80 is supported by the frame 12) and each of the first and second thermal-expansion-detecting-mark imaging positions, on an assumption that the amount of thermal expansion of each Y-axis ballscrew 40, 80 at the proximal end is zero, and an assumption that the amount of thermal expansion at a given axial point of the Y-axis ballscrew 40, 80 is not proportionally increased with a distance of that axial position from the reference point on the ballscrew 40, 80.

It will be understood from the above description of the present third embodiment that the frame 12 is an example of a main body structure of the electronic-component mounting system 200 and that the X-axis and Y-axis ballscrews 38, 40 of each component-mounting robot 22 cooperate to constitute an example of a motion-transmitting member, while the X-axis and Y-axis ballscrews 78, 80 of the image-taking robot 24 cooperate to constitute an example of a motion-transmitting member.

It will also be understood that the thermal-expansion detecting mark 220 at the first thermal-expansion-detecting-mark imaging position cooperates with the main body 94, projecting member 96 and surface-light-emitting sheet 98, to constitute an example of an object to be imaged by the second image-taking device 74, while the other thermal-expansion detecting mark 222 at the second thermal-expansion-detecting-mark imaging position cooperates with the main body 94, projecting member 96 and surface-light-emitting sheet 98, to constitute another example of an object to be imaged by the second image-taking device 74. It will further be understood that each of the thermal-expansion detecting marks 220, 222 is an example of a central portion of the image to be imaged, while each of the first image-taking devices 210, 212 is an example of an image-taking device operable to take an image of an electric component in the form of the electronic component 30.

It will further be understood that each of the positions on the frame 12 at which the two first image-taking devices 210 and 212 are fixedly disposed, respectively, is an example of a position at which the image-taking devices 210, 212 are not substantially influenced by the thermal expansion of the electric-component mounting system and other factors of the system, and that each of the positions on the frame 12 at which the two thermal-expansion detecting marks 220 and 222 are fixedly disposed, respectively, is another example of the position at which the detecting marks 220, 222 are not substantially influenced by the thermal expansion and other factors of the system.

It will further be understood that a portion of the controller 100 assigned to implement step S65 of FIG. 19, step S85 of FIG. 20 and steps S103 and S106 of FIG. 21 constitutes an example of proportional-type drive-signal determining means. Described more specifically, this proportional-type drive-signal determining means is arranged to estimate the Y-axis thermal-expansion amount $\Delta Y_{EPM}$ at the component imaging position and the Y-axis final component-hold-position error amount $\Delta Y_P^F$ in step S65, calculate the Y-axis thermal-expansion amount $\Delta Y_{EBM}$ at the fiducial-mark imaging position and the Y-axis final substrate-position error amount $\Delta Y_B^F$ in step S85, and calculate the provisional and final Y-axis drive signals $S_Y^P$, $S_Y^F$ in step S103 and S106. It will further be understood that one of the first and second thermal-expansion-detecting-mark imaging positions is an example of a reference point on the motion-transmitting member.

In the first and third embodiments described above, the thermal-expansion detecting mark 54 is disposed on the component-mounting head 32, at a position spaced from the component holder 50 for holding the electronic component 30. However, the component holder 50 may be provided with a thermal-expansion detecting mark an image of which is taken by the first image-taking device 52 to detect the amount of thermal expansion, while the electronic component 30 is not held by the component holder 50. This arrangement requires a smaller degree of modification of the component-holding head 32 for detecting the amount of thermal expansion.

In the illustrated embodiments described above, each of the ballscrews 38, 40, 78, 80 is fixedly supported at its one end. However, the principle of the present invention is applicable to an electric-component mounting system wherein each of the ballscrews is fixed supported at its opposite ends. In this case, the thermal expansion of the ballscrews takes place in a pattern or mode different from that of the ballscrews supported at their one end. Accordingly, it is preferable to take this aspect into account in determining the positions and number of the thermal-expansion detecting marks.

Where any of the ballscrews 38, 40, 78, 80 are required to exhibit a high degree of positioning accuracy over a selected portion of their length, not over their entire length, at least one thermal-expansion detecting mark is preferably disposed so as to directly detect the amount of thermal expansion of that ballscrew. Where the length of the selected portion of the ballscrew is comparatively small, the directly detected amount of thermal expansion may be used to compensate the hold-position of the electronic component 30, the position of the fiducial mark 76 on the substrate 26, and the drive signals to operate the servomotors 46, 48, 82, 84, irrespective of the axial position of the ballscrew at which the electronic component 30 is mounted on the substrate 26 or the image of the fiducial mark 76 is taken. In this case, the mounting accuracy of the electronic component 30 can be significantly improved by the compensation on the basis of the detected amount of thermal expansion.

While some presently preferred embodiments of this invention and some modifications thereof have been described in detail, for illustrative purpose only, it is to be understood that the present invention may be embodied with various other changes, modifications and improvements, such as those described in the SUMMARY OF THE INVENTION, which may occur to those skilled in the art, without departing from the spirit and scope of the invention defined in the following claims:

What is claimed is:

1. An electric-component mounting system wherein an electric component held by a component holder is moved to and positioned at a target mounting position on a substrate supported by a substrate supporting device, and the positioned electric component is mounted on the substrate, said electric-component mounting system comprising:

a main body structure;

a drive device;

a movable portion movable relative to said main body structure;

a motion-transmitting member disposed on said main body structure and linearly extending in one direction, said motion-transmitting member being operable to give said movable portion a linear motion in said one direction during an operation of said drive device, such that thermal expansion of said motion-transmitting member causes a corresponding positioning error of said movable portion in the direction of said linear motion;

a member fixedly disposed on said movable portion;

an image-taking device fixedly disposed on said main body structure and operable to take an image of said member, said member being spaced apart from said component holder in a direction parallel to said substrate as supported by said substrate supporting device, said member and said image-taking device being disposed relative to each other such that an error of relative positioning of said member and said image-taking device, which is detected on the basis of the image of said member taken by said image-talcing device, substantially represents a thennal-expansion positioning error which is a positioning error of said member, which positioning error is derived from thermal expansion of the electric-component mounting system; and a controller operable to apply a drive signal to said drive device, for controlling a position of said movable portion in the direction of said linear motion, said controller determining said drive signal on the basis of said image of said member taken by said image-taking device, so as to reduce an amount of influence of said thermal-expansion positioning error on an actual position of said movable portion in the direction of said linear motion.

2. The electric-component mounting system according to claim 1, wherein said image-taking device is fixedly disposed at a portion of said main body structure at which a position of said image-taking device is not substantially influenced by the thermal expansion of the electric-component mounting system, while said member is fixedly disposed at a portion of said movable portion at which a position of said member is influenced by the thermal expansion of the electric-component mounting system.

3. The electric-component mounting system according to claim 1, wherein said movable portion carries said component holder operable to hold said electric component by suction, and said image-taking device is operable to take not only the image of said member but also an image of said electric component as held by said component holder, said controller determining said drive signal on the basis of said image of said electric component as well as said image of said member.

4. The electric-component mounting system according to claim 1, wherein said movable portion includes a first movable portion, and a second movable portion which carries said component holder operable to hold said electric component by suction, and said motion-transmitting member includes a first motion-transmitting member and a second motion-transmitting member which are operable to move said first and second movable portions, respectively, and which extend in respective directions intersecting each other, the first motion-transmitting member being directly mounted at one of opposite ends thereof on said main body structure, while said second motion-transmitting member being mounted at one of opposite ends thereon on said first movable portion and indirectly mounted on said main body structure, said member being fixedly disposed on said second movable portion.

5. The electric-component mounting system according to claim 1, wherein said movable portion includes a first movable portion, and a second movable portion which carries said component holder operable to hold said electric component by suction, and said motion-transmitting member includes a first motion-transmitting member and a second motion-transmitting member which are operable to move said first and second movable portions, respectively, and which extend in respective directions intersecting each other, the first motion-transmitting member being directly mounted at one of opposite ends thereof on said main body structure, while said second motion-transmitting member being mounted at one of opposite ends thereon on said first movable portion and indirectly mounted on said main body structure, said member being fixedly disposed on said first movable portion.

6. The electric-component mounting system according to claim 1, wherein said movable portion includes a first movable portion, and a second movable portion which carries said component holder operable to hold said electric component by suction, and said motion-transmitting member includes a first motion-transmitting member and a second motion-transmitting member which are operable to move said first and second movable portions, respectively, and which extend in respective directions intersecting each other, the first motion-transmitting member being directly mounted at one of opposite ends thereof on said main body structure, while said second motion-transmitting member being mounted at one of opposite ends thereon on said first movable portion and indirectly mounted on said main body structure, said member consisting of two members fixedly disposed on said first and second movable portions, respectively.

7. The electric-component mounting system according to claim 1, wherein said movable portion consists of a plurality of movable portions at least one of which includes said component holder operable to hold said electric component by suction, at least one of the other of said plurality of movable portions including a movable member movable relative to said substrate, for the image-taking device to take an image of a fiducial mark provided on said substrate, said member consisting of a plurality of members including at least one first member fixedly disposed on said at least one movable portion, and at least one second member which corresponds to said at least one of said other of said plurality movable portions and which is fixedly disposed on said main body structure, said image-taking device consisting a plurality of image-taking devices including at least one first image-taking device which corresponds to said at least one movable portion and each of which is fixedly disposed on said main body portion and operable to take not only an image of said at least one first member but also an image of said electric component held by said component holder, said plurality of image-taking device further including at least one second image-taking device which is fixedly disposed on said at least one of said other of said plurality of movable portions, for taking not only an image of said at least one second member but also the image of said fiducial mark, and wherein said controller determines said drive signal, on the basis of the images of said at least one first member and said electric component taken by said at least one first image-taking device and the images of said at least one second member and said fiducial mark taken by said at least one second image-taking device, so as to reduce the amount of influence of said thermal-expansion positioning error on the actual position of each of said plurality of movable portions in the direction of said linear motion.

8. The electric-component mounting system according to claim 1, comprising a plurality of positioning devices each of which consists of said movable portion, said drive device and said motion-transmitting member, and wherein a set of said member and said image-taking device is provided for each of said plurality of positioning devices.

9. The electric-component mounting system according to claim 1, wherein one of said member and said image-taking device which is fixedly disposed on said main body structure is provided at a plurality of positions which are spaced apart from each other in the direction of extension of said motion-transmitting member.

10. The electric-component mounting system according to claim 1, wherein said member has a central portion and a peripheral portion which are imaged by said image-taking device such that said central portion and said peripheral portion can be distinguished from each other, said central portion and said peripheral portion lie in respective two parallel planes which are spaced from said image-taking device by respective different distances when the image of said member is taken by said image-taking device, said central portion lying on one of said two parallel planes which is nearer to said image-taking device than the other plane.

11. The electric-component mounting system according to claim 10, wherein said central portion has a surface having a lower value of brightness than a surface of said peripheral portion.

12. The electric-component mounting system according to claim 11, wherein the surface of said central portion has a lower value of light reflectance than the surface of said peripheral portion.

13. The electric-component mounting system according to claim 11, wherein the surface of said central portion does not emit a light while the surface of said peripheral portion emits a light.

14. The electric-component mounting system according to claim 10, wherein said member includes a main body, and a projecting portion extending from a surface of said main body, said central portion consisting of a distal end face of said projecting portion, while said peripheral portion consisting of a portion of the surface of said main body which surrounds a proximal end of said projecting portion.

15. The electric-component mounting system according to claim 14, wherein said end face of said projecting portion has a circular shape.

16. The electric-component mounting system according to claim 14, wherein said distal end face of said projecting portion has an outer profile located outwardly of an outer profile of said proximal end, as seen in a direction in which the image of said member is taken by said image-taking device.

17. The electric-component mounting system according to claim 16, wherein said peripheral portion is provided by an adhesive-backed layer attached to said portion of the surface of said main body, and said projecting portion is a projecting part of a projecting member, said projecting part having said distal end face, and a proximal end face opposite to said distal end face, said projecting member including a proximal end part having a smaller size in transverse cross section than said projecting part, said projecting member having a shoulder surface formed between said proximal end part and said proximal end face of said projecting part, said adhesive-backed layer having a through-hole in which said proximal end part is fitted such that said shoulder surface is held in contact with a portion of said adhesive-backed layer in which said through-hole is formed.

18. The electric-component mounting system according to claim 1, wherein said controller includes imaging-frequency control means for operating said image-taking device to take the image of said member more frequently when a rate of change of said thermal-expansion positioning error is relatively high than when said rate of change is relatively low.

19. The electric-component mounting system according to claim 1, wherein said controller includes proportional-type drive-signal determining means for determining said drive signal, so as to reduce the amount of influence of said thermal-expansion positioning error on the actual position of said movable portion in the direction of said linear motion, on an assumption that an amount of thermal expansion of said motion-transmitting member at a given position in the direction of said linear motion is proportionally increased with a distance of said given position from a predetermined reference point established on said motion-transmitting member in the direction of said linear motion.

20. The electric-component mounting system according to claim 1, wherein said member and said image-taking device are disposed relative to each other, so as to permit said image-taking device to take said image of said member while said electric component is held by said component holder.

21. An electric-component mounting system wherein an electric component held by a component holder is moved to and positioned at a target mounting position on a substrate, and the positioned electric component is mounted on the substrate, said electric-component mounting system comprising:

a main body structure;

a drive device;

a movable portion movable relative to said main body structure;

a motion-transmitting member disposed on said main body structure and linearly extending in one direction, said motion-transmitting member being operable to give said movable portion a linear motion in said one direction during an operation of said drive device, such that thermal expansion of said motion-transmitting member causes a corresponding positioning error of said movable portion in the direction of said linear motion;

a member fixedly disposed on said main body;

an image-taking device fixedly disposed on said movable portion and operable to take an image of said member, said member and said image-taking device being disposed relative to each other such that an error of relative positioning of said member and said image-taking device, which is detected on the basis of the image of said member taken by said image-taking device, substantially represents a thermal-expansion positioning error which is a positioning error of said member, which positioning error is derived from thermal expansion of the electric-component mounting system; and a controller operable to apply a drive signal to said drive device, for controlling a position of said movable portion in the direction of said linear motion, said controller determining said drive signal on the basis of said image of said member taken by said image-taking device, so as to reduce an amount of influence of said thermal-expansion positioning error on an actual position of said movable portion in the direction of said linear motion.

22. The electric-component mounting system according to claim 21, wherein said member is fixedly disposed at a portion of said main body structure at which a position of said member is not substantially influenced by the thermal expansion of the electric-component mounting system, while said image-taking device is fixedly disposed at a portion of said movable portion at which a position of said image-taking device is influenced by the thermal expansion of the electric-component mounting system.

23. The electric-component mounting system according to claim 21, wherein said movable portion includes a movable member which is movable relative to said substrate and which carries said image-taking device, said image-taking device being moved with said movable member to take an image of a fiducial mark provided on said substrate, as well as the image of said member, said member being fixedly disposed on said main body structure, said controller determining said drive signal on the basis of said image of said fiducial mark as well as said image of said member.

24. The electric-component mounting system according to claim 21, wherein said movable portion consists of a plurality of movable portions at least one of which includes said component holder operable to bold said electric component by suction, at least one of the other of said plurality of movable portions including a movable member movable relative to said substrate, for the image-taking device to take an image of a fiducial mark provided on said substrate, said member consisting of a plurality of members including at least one first member fixedly disposed on said at least one movable portion, and at least one second member which corresponds to said at least one of said other of said plurality movable portions and which is fixedly disposed on said main body structure, said image-taking device consisting a plurality of image-taking devices including at least one first image-taking device which corresponds to said at least one movable portion and each of which is fixedly disposed on said main body portion and operable to take not only an image of said at least one first member but also an image of said electric component held by said component holder, said plurality of image-taking device further including at least one second image-taking device which is fixedly disposed on said at least one of said other of said plurality of movable portions, for taking not only an image of said at least one second member but also the image of said fiducial mark, and wherein said controller determines said drive signal, on the basis of the images of said at least one first member and said electric component taken by said at least one first image-taking device and the images of said at least one second member and said fiducial mark taken by said at least one second image-taking device, so as to reduce the amount of influence of said thermal-expansion positioning error on the actual position of each of said plurality of movable portions in the direction of said linear motion.

25. The electric-component mounting system according to claim 21, wherein one of said member and said image-taking device which is fixedly disposed on said main body structure is provided at a plurality of positions which are spaced apart from each other in the direction of extension of said motion-transmitting member.

26. The electric-component mounting system according to claim 21, wherein said member has a central portion and a peripheral portion which are imaged by said image-taking device such that said central portion and said peripheral portion can be distinguished from each other, said central portion and said peripheral portion lie in respective two parallel planes which are spaced from said image-taking device by respective different distances when the image of said member is taken by said image-taking device, said central portion lying on one of said two parallel planes which is nearer to said image-taking device than the other plane.

27. The electric-component mounting system according to claim 26, wherein said central portion has a surface having a lower value of brightness than a surface of said peripheral portion.

28. The electric-component mounting system according to claim 27, wherein the surface of said central portion has a lower value of light reflectance than the surface of said peripheral portion.

29. The electric-component mounting system according to claim 27, wherein the surface of said central portion does not emit a light while the surface of said peripheral portion emits a light.

30. The electric-component mounting system according to claim 26, wherein said member includes a main body, and a projecting portion extending from a surface of said main body, said central portion consisting of a distal end face of said projecting portion, while said peripheral portion consisting of a portion of the surface of said main body which surrounds a proximal end of said projecting portion.

31. The electric-component mounting system according to claim 30, wherein said end face of said projecting portion has a circular shape.

32. The electric-component mounting system according to claim 30, wherein said distal end face of said projecting portion has an outer profile located outwardly of an outer profile of said proximal end, as seen in a direction in which the image of said member is taken by said image-taking device.

33. The electric-component mounting system according to claim 32, wherein said peripheral portion is provided by an adhesive-backed layer attached to said portion of the surface of said main body, and said projecting portion is a projecting part of a projecting member, said projecting part having said distal end face, and a proximal end face opposite to said distal end face, said projecting member including a proximal end part having a smaller size in transverse cross section than said projecting part, said projecting member having a shoulder surface formed between said proximal end part and said proximal end face of said projecting part, said adhesive-backed layer having a through-hole in which said proximal end part is fitted such that said shoulder surface is held in contact with a portion of said adhesive-backed layer in which said through-hole is formed.

34. The electric-component mounting system according to claim 23, wherein said controller includes imaging-frequency control means for operating said image-taking device to take the image of said member more frequently when a rate of change of said thermal-expansion positioning error is relatively high than when said rate of change is relatively low.

35. The electric-component mounting system according to claim 23, wherein said controller includes proportional-type drive-signal determining means for determining said drive signal, so as to reduce the amount of influence of said thermal-expansion positioning error on the actual position of said movable portion in the direction of said linear motion, on an assumption that an amount of thermal expansion of said motion-transmitting member at a given position in the direction of said linear motion is proportionally increased with a distance of said given position from a predetermined reference point established on said motion-transmitting member in the direction of said linear motion.

* * * * *